(12) United States Patent
Irwin et al.

(10) Patent No.: US 12,046,425 B2
(45) Date of Patent: Jul. 23, 2024

(54) PHOTOVOLTAIC DEVICE ENCAPSULATION

(71) Applicant: CubicPV Inc., Dallas, TX (US)

(72) Inventors: Michael D. Irwin, Dallas, TX (US); Kamil Mielczarek, Rowlett, TX (US)

(73) Assignee: CubicPV Inc., Bedford, MA (US)

( * ) Notice: Subject to any disclaimer, the term of this patent is extended or adjusted under 35 U.S.C. 154(b) by 0 days.

(21) Appl. No.: 15/488,151

(22) Filed: Apr. 14, 2017

(65) Prior Publication Data

US 2018/0301288 A1    Oct. 18, 2018

(51) Int. Cl.
*H10K 30/30*    (2023.01)
*H01G 9/20*    (2006.01)
(Continued)

(52) U.S. Cl.
CPC ......... *H01G 9/2077* (2013.01); *H01G 9/2018* (2013.01); *H01G 9/2081* (2013.01); *H10K 30/30* (2023.02); *H10K 30/451* (2023.02); *H10K 30/82* (2023.02); *H10K 30/88* (2023.02); *H10K 85/141* (2023.02); *H10K 85/30* (2023.02); *H01G 9/2027* (2013.01); *H01G 9/2059* (2013.01); *H10K 2102/00* (2023.02); *Y02E 10/549* (2013.01)

(58) Field of Classification Search
CPC ............... Y02E 10/549; H01L 51/0077; H01L 51/442; H01L 51/448; H01L 51/004; H01L 51/4253; H01L 51/4206; H01L 31/0077; H01L 31/442; H01L 31/448; H01L 31/004; H01L 31/4253; H01L 31/4206; H01G 9/2018; H01G 9/2081; H01G 9/2027; H01G 9/2059; H10K 85/30; H10K 85/141; H10K 30/88; H10K 30/451; H10K 30/30; H10K 30/82
See application file for complete search history.

(56) References Cited

U.S. PATENT DOCUMENTS 5,843,341 A * 12/1998 Orita ................... C01G 15/006
136/252
10,193,087 B2  1/2019 Irwin et al.
(Continued)

FOREIGN PATENT DOCUMENTS

EP       2339641 A2    6/2011
JP      2004139991 A    5/2004
(Continued)

OTHER PUBLICATIONS

Extended European Search Report for EP Application No. 18784901. 3, dated Jan. 22, 2021, 15 pages.
(Continued)

*Primary Examiner* — Uyen M Tran
(74) *Attorney, Agent, or Firm* — Baker Botts L.L.P.

(57) ABSTRACT

A photovoltaic device comprising a first electrode, a second electrode, an active layer disposed at least partially between the first and second electrodes, an interfacial layer disposed at least partially between the first and second electrodes, and a non-stoichiometric oxide layer disposed at least partially between and in contact with one of the first or second electrodes and an encapsulant layer. The active layer of the photovoltaic device comprises a photoactive material.

18 Claims, 18 Drawing Sheets

(51) Int. Cl.
  *H10K 30/00* (2023.01)
  *H10K 30/82* (2023.01)
  *H10K 30/88* (2023.01)
  *H10K 85/10* (2023.01)
  *H10K 85/30* (2023.01)
  *H10K 85/50* (2023.01)
  *H10K 102/00* (2023.01)

(56) References Cited

U.S. PATENT DOCUMENTS

| | | | |
|---|---|---|---|
| 2004/0081855 A1 | 4/2004 | Kim et al. | |
| 2005/0039670 A1* | 2/2005 | Hosono | C30B 23/02 117/2 |
| 2005/0051204 A1* | 3/2005 | Oi | H01L 31/048 136/251 |
| 2007/0012353 A1* | 1/2007 | Fischer | H02S 20/23 136/251 |
| 2007/0068571 A1 | 3/2007 | Li et al. | |
| 2009/0044864 A1* | 2/2009 | Thompson | B82Y 10/00 136/263 |
| 2010/0132772 A1* | 6/2010 | Asano | B82Y 10/00 136/252 |
| 2011/0303277 A1* | 12/2011 | Neumann | B32B 7/12 136/256 |
| 2012/0286271 A1* | 11/2012 | Oh | H01L 29/7869 257/57 |
| 2013/0276878 A1* | 10/2013 | Nakazawa | H01M 14/005 136/256 |
| 2014/0179040 A1 | 6/2014 | Ramadas et al. | |
| 2014/0182650 A1* | 7/2014 | Lochun | H02S 40/36 136/258 |
| 2014/0332063 A1* | 11/2014 | Devisme | B32B 17/10018 136/251 |
| 2015/0144195 A1* | 5/2015 | Irwin | H01G 9/2027 136/260 |
| 2015/0243444 A1* | 8/2015 | Irwin | H01G 9/2027 136/261 |
| 2015/0303389 A1 | 10/2015 | Kim et al. | |
| 2016/0075881 A1* | 3/2016 | Irwin | H01G 9/2027 427/74 |
| 2016/0155974 A1 | 6/2016 | Wang et al. | |
| 2016/0248027 A1 | 8/2016 | Irwin et al. | |

FOREIGN PATENT DOCUMENTS

| | | |
|---|---|---|
| JP | 2010-034489 A | 2/2010 |
| JP | 2010034489 A | 2/2010 |
| JP | 2012-064645 A | 3/2012 |
| JP | 2012064645 A | 3/2012 |
| JP | 2013168672 A | 8/2013 |
| JP | 2017-504188 | 2/2017 |
| WO | 2014/045021 A1 | 3/2014 |

OTHER PUBLICATIONS

Qi, Lei et al., "Performance improvement of inverted organic solar cells by adding ultrathin Al2O3 as an electron selective layer and a plasma enhanced chemical vapor deposition of SiOx encapsulating layer", Thin Solid Films 567 (2014) 1-7.

Kaltenbrunner, Martin et al., "Flexible high power-per-weight perovskite solar cells with chromium oxide-metal contacts for improved stability in air", Nature Materials, vol. 14, No. 10, published on-line Aug. 24, 2015, XP055762221.

Lim Ju Won et al., "Transparent high-performance SiOxNy/SiOx barrier films for organic photovoltaic cells with high durability", Nano Energy 33 (2017) 12-20, Accepted Jan. 10, 2017.

Zhu Tao et al., "High photovoltages of CuFeO2 based p-type dye-sensitized solar cells", Journal of Alloys and Compounds, 685 (2016) 836-840.

Vasilopoulou Maria et al., "Reduced molybdenum oxide as an efficient electron injection layer in polymer light-emitting diodes" Applied Physics Letters 98, 123301 (2011), Published Mar. 22, 2011, 3 pages.

Abraham K I, "Status of Rehchargeable Positive Electrodes for Ambient Temperature Lithium Batteries", Journal of Powr Sources, vol. 7 (1981), No. 1, pp. 1-43, XP-001275841.

Axmann P. et al. "Nonstoichiometric LiFePO4: Defects and Related Properties", Chem. Mater. 2009, 21, 1636-1644, XP-002578838.

Chen, Dengjie et al., "Nonstoichiometric Oxides as Low-Cost and Highly-Efficient Oxygen Reduction/Evolution Catalysts for Low-Temperature Electrochemical Devices", Chem. Rev. 2015, 115, 9869-9921, Published Sep. 14, 2015.

Wilderspoin Timothy J. et al., "A simple method to evaluate the effectiveness of encapsulation materials for perovskite solar cells", Solar Energy 139 (2016) 426-432.

PCT Notification of Transmittal of The International Search Report and the Written Opinion of the International Searching Authority, of the Declaration regarding PCT/US2018/027073 (2 pages); mail date: Jul. 13, 2018.

PCT International Search Report for PCT/US2018/027073 (5 pages); mail date: Jul. 13, 2018.

PCT Written Opinion of the International Searching Authority for PCT/US2018/027073 (9 pages); mail date: Jul. 13, 2018.

Chinese Patent Office, Chinese Office Action for Chinese Application No. 201880033074.1, Issued Jul. 21, 2022, with translation, 57 pages.

Final notification of Reasons for Refusal, Japanese Patent Application No. 2019-555794, Dated Oct. 25, 2022, Mailed Nov. 1, 2022.

Japanese Patent Office, Japanese Office Action for Japanese Application No. 2019-555794, issued Mar. 1, 2022, with translation, 11 pages.

China National Intellectual Property Administration's Rejection Decision in Chinese Patent Application No. 201880033074.1, mailed May 17, 2023, 11 pages.

Communication pursuant to Article 94(3) EPC, European Patent Application No. 18784901.3, Mailed Jan. 20, 2023, 8 pages.

Kofstad Per: "Defects and transport properties of metal oxides", Oxidation of Metals, vol. 44, No. 1-2, Aug. 1, 1995 (Aug. 1, 1995), pp. 3-27, XP093013167, US, ISSN: 0030-770X, DOI: 10.1007/BF01046721.

Boix Pablo P. et al: "Current progress and future perspectives for organic/inorganic perovskite solar cells", Materials Today, vol. 17, No. 1, Jan. 1, 2014 (Jan. 1, 2014), pp. 16-23, XP093013168, Amsterdam, NL ISSN: 1369-7021, DOI: 10.1016/j.mattod.2013.12. 002.

KIPO's Notice of Preliminary Rejection in Korean Patent Application No. 10-2019-7033305, Mailed Apr. 20, 2023, 20 pages.

* cited by examiner

PHOTOVOLTAIC DEVICE ENCAPSULATION

BACKGROUND

Use of photovoltaics (PVs) to generate electrical power from solar energy or radiation may provide many benefits, including, for example, a power source, low or zero emissions, power production independent of the power grid, durable physical structures (no moving parts), stable and reliable systems, modular construction, relatively quick installation, safe manufacture and use, and good public opinion and acceptance of use.

Portions of PVs may be susceptible to oxidation or corrosion by substances present in the environment. PVs may function better if protected from environmental oxidation or corrosion.

The features and advantages of the present disclosure will be readily apparent to those skilled in the art. While numerous changes may be made by those skilled in the art, such changes are within the spirit of the invention.

DETAILED DESCRIPTION OF PREFERRED EMBODIMENTS

Figure 1:
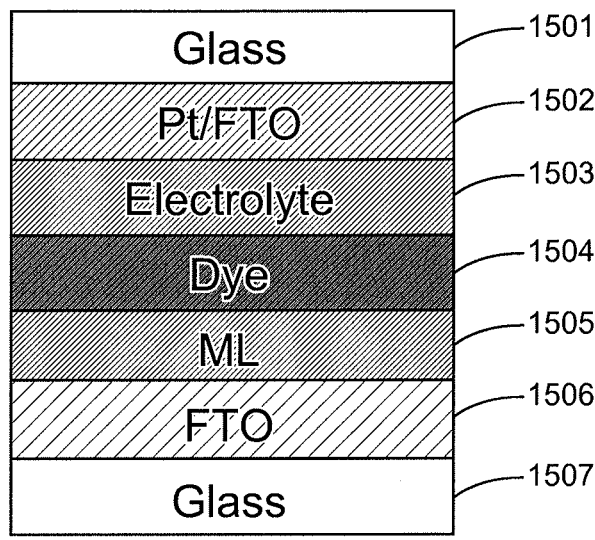
FIG. 1 is an illustration of DSSC design depicting various layers of the DSSC according to some embodiments of the present disclosure.

Improvements in various aspects of PV technologies compatible with organic, non-organic, and/or hybrid PVs promise to further lower the cost of both organic PVs and other PVs. For example, some solar cells, such as solid-state dye-sensitized solar cells, may take advantage of novel cost-effective and high-stability alternative components, such as solid-state charge transport materials (or, colloquially, "solid state electrolytes"). In addition, various kinds of solar cells may advantageously include interfacial and other materials that may, among other advantages, be more cost-effective and durable than conventional options currently in existence.

The present disclosure relates generally to compositions of matter, apparatus and methods of use of materials in photovoltaic cells in creating electrical energy from solar radiation. More specifically, this disclosure relates to photoactive and other compositions of matter, as well as apparatus, methods of use, and formation of such compositions of matter.

Examples of these compositions of matter may include, for example, hole-transport materials, and/or materials that may be suitable for use as, e.g., interfacial layers (IFLs), dyes, and/or other elements of PV devices. Such compounds may be deployed in a variety of PV devices, such as heterojunction cells (e.g., bilayer and bulk), hybrid cells (e.g., organics with $CH_3NH_3PbI_3$, ZnO nanorods or PbS quantum dots), and DSSCs (dye-sensitized solar cells). The latter, DSSCs, exist in three forms: solvent-based electrolytes, ionic liquid electrolytes, and solid-state hole transporters (or solid-state DSSCs, i.e., SS-DSSCs). SS-DSSC structures according to some embodiments may be substantially free of electrolyte, containing rather hole-transport materials such as spiro-OMeTAD, $CsSnI_3$, and other active materials.

Some or all of materials in accordance with some embodiments of the present disclosure may also advantageously be used in any organic or other electronic device, with some examples including, but not limited to: batteries, field-effect transistors (FETs), light-emitting diodes (LEDs), non-linear optical devices, memristors, capacitors, rectifiers, and/or rectifying antennas.

In some embodiments, the present disclosure may provide PV and other similar devices (e.g., batteries, hybrid PV batteries, multi junction PVs, FETs, LEDs etc.). Such devices may in some embodiments include improved active material, interfacial layers, and/or one or more perovskite materials. A perovskite material may be incorporated into various of one or more aspects of a PV or other device. A perovskite material according to some embodiments may be of the general formula $CMX_3$, where: C comprises one or more cations (e.g., an amine, ammonium, a Group 1 metal, a Group 2 metal, and/or other cations or cation-like compounds); M comprises one or more metals (example s including Fe, Co, Ni, Cu, Sn, Pb, Bi, Ge, Ti, and Zn); and X comprises one or more anions. Perovskite materials according to various embodiments are discussed in greater detail below.

Photovoltaic Cells and Other Electronic Devices

Figure 3:
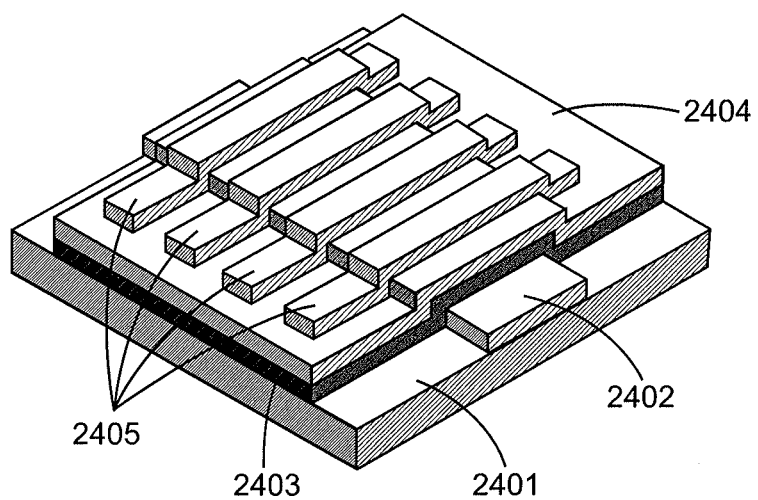
FIG. 3 is an example illustration of BHJ device design according to some embodiments of the present disclosure.
Figure 4:
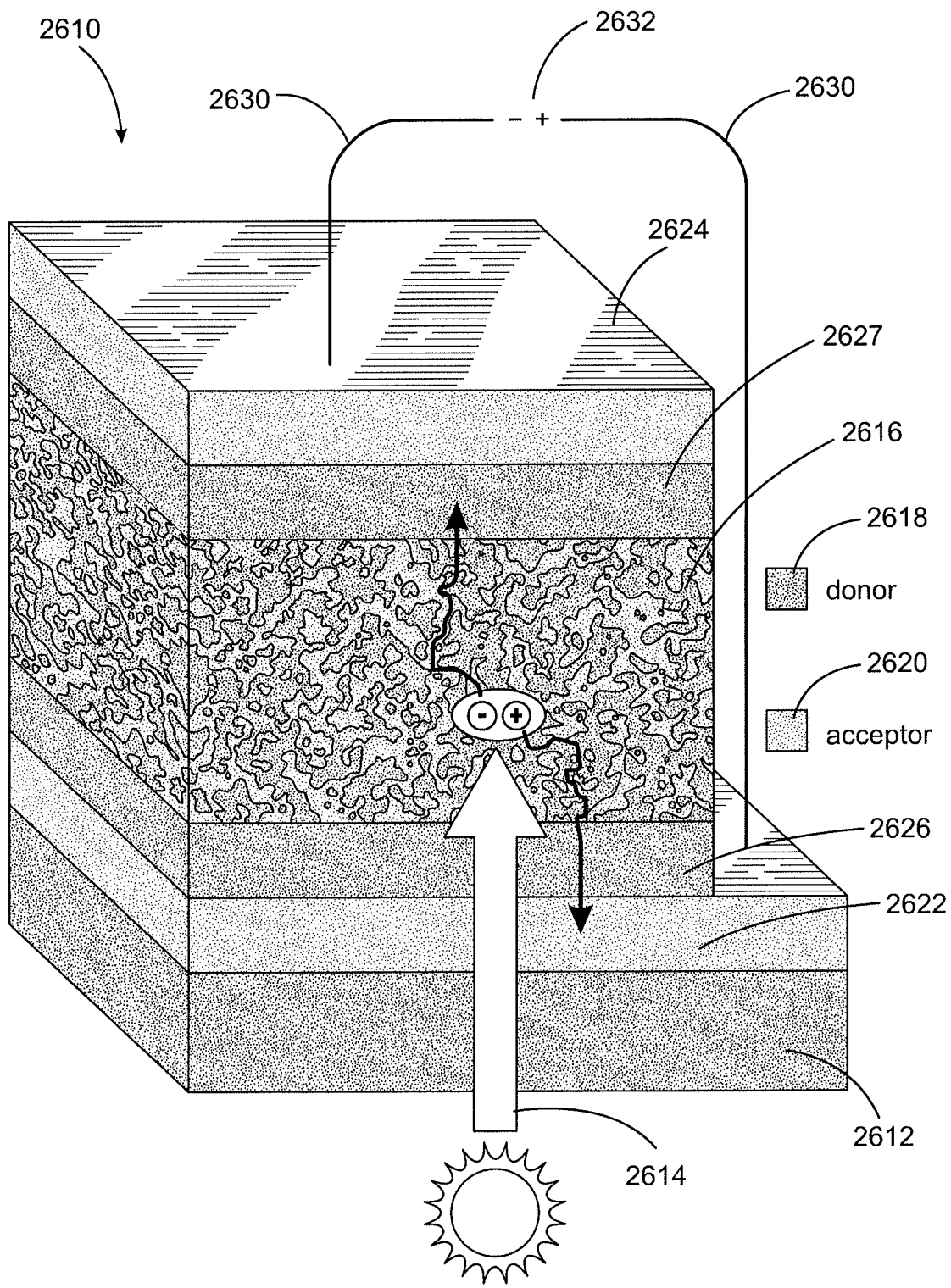
FIG. 4 is a schematic view of a typical photovoltaic cell including an active layer according to some embodiments of the present disclosure.

Some PV embodiments may be described by reference to various illustrative depictions of solar cells as shown in FIGS. 1, 3, 4, and 5. For example, an example PV architecture according to some embodiments may be substantially of the form substrate-anode-IFL-active layer-IFL-cathode. The active layer of some embodiments may be photoactive, and/or it may include photoactive material. Other layers and materials may be utilized in the cell as is known in the art. Furthermore, it should be noted that the use of the term "active layer" is in no way meant to restrict or otherwise define, explicitly or implicitly, the properties of any other layer—for instance, in some embodiments, either or both IFLs may also be active insofar as they may be semiconducting. In particular, referring to FIG. 4, a stylized generic PV cell 2610 is depicted, illustrating the highly interfacial nature of some layers within the PV. The PV 2610 represents a generic architecture applicable to several PV devices, such as perovskite material PV embodiments. The PV cell 2610 includes a transparent layer 2612 of glass (or material similarly transparent to solar radiation) which allows solar radiation 2614 to transmit through the layer. The transparent layer of some embodiments may also be referred to as a substrate (e.g., as with substrate layer 1507 of FIG. 1), and it may comprise any one or more of a variety of rigid or flexible materials such as: glass, polyethylene, PET, Kapton, quartz, aluminum foil, gold foil, or steel. The photoactive layer 2616 is composed of electron donor or p-type material 2618, and/or an electron acceptor or n-type material 2620, and/or an ambipolar semiconductor, which exhibits both p- and n-type material characteristics. The active layer or, as depicted in FIG. 4, the photoactive layer 2616, is sandwiched between two electrically conductive electrode layers 2622 and 2624. In FIG. 4, the electrode layer 2622 is a tin-doped indium oxide (ITO material). As previously noted, an active layer of some embodiments need not necessarily be photoactive, although in the device shown in FIG. 4, it is. The electrode layer 2624 is an aluminum material. Other materials may be used as is known in the art. The cell 2610 also includes an interfacial layer (IFL) 2626, shown in the example of FIG. 4 as a ZnO material. The IFL may assist in charge separation. In some embodiments, the IFL 2626 may comprise an organic compound according to the present disclosure as a self-assembled monolayer (SAM) or as a thin film. In other embodiments, the IFL 2626 may comprise a multi-layer IFL, which is discussed in greater detail below. There also may be an IFL 2627 adjacent to electrode 2624. In some embodiments, the IFL 2627 adjacent to electrode 2624 may also or instead comprise an organic compound according to the present disclosure as a self-assembled monolayer (SAM) or as a thin film. In other embodiments, the IFL 2627 adjacent to electrode 2624 may also or instead comprise a multi-layer IFL (again, discussed in greater detail below). An IFL according to some embodiments may be semiconducting in character and may be either p-type or n-type, or it may be dielectric in character. In some embodiments, the IFL on the cathode side of the device (e.g., IFL 2627 as shown in FIG. 4) may be p-type, and the IFL on the anode side of the device (e.g., IFL 2626 as shown in FIG. 4) may be n-type. In other embodiments, however, the cathode-side IFL may be n-type and the anode-side IFL may be p-type. The cell 2610 is attached to leads 2630 and a discharge unit 2632, such as a battery.

Yet further embodiments may be described by reference to FIG. 3, which depicts a stylized BHJ device design, and includes: glass substrate 2401; ITO (tin-doped indium oxide) electrode 2402; interfacial layer (IFL) 2403; photoactive layer 2404; and LiF/Al cathodes 2405. The materials of BHJ construction referred to are mere examples; any other BHJ construction known in the art may be used consistent with the present disclosure. In some embodiments, the photoactive layer 2404 may comprise any one or more materials that the active or photoactive layer 2616 of the device of FIG. 4 may comprise.

Figure 2:
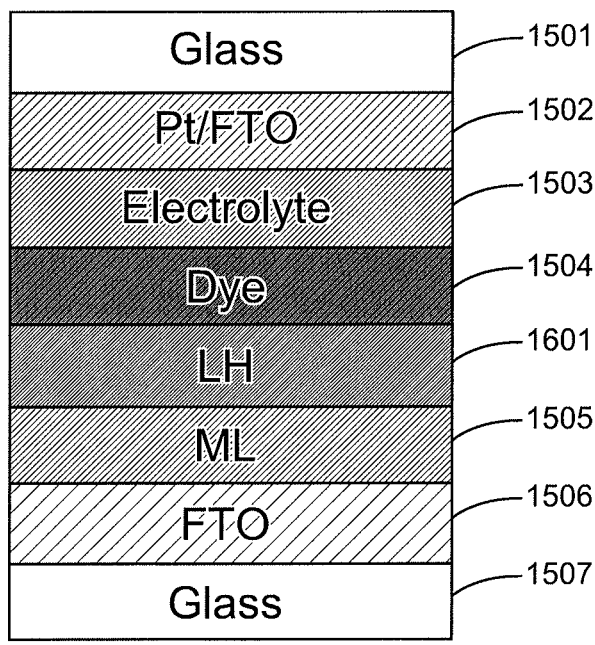
FIG. 2 is another illustration of DSSC design depicting various layers of the DSSC according to some embodiments of the present disclosure.

FIG. 1 is a simplified illustration of DSSC PVs according to some embodiments, referred to here for purposes of illustrating assembly of such example PVs. An example DSSC as shown in FIG. 1 may be constructed according to the following: electrode layer 1506 (shown as fluorine-doped tin oxide, FTO) is deposited on a substrate layer 1507 (shown as glass). Mesoporous layer ML 1505 (which may in some embodiments be $TiO_2$) is deposited onto the electrode layer 1506, then the photoelectrode (so far comprising substrate layer 1507, electrode layer 1506, and mesoporous layer 1505) is soaked in a solvent (not shown) and dye 1504. This leaves the dye 1504 bound to the surface of the ML. A separate counter-electrode is made comprising substrate layer 1501 (also shown as glass) and electrode layer 1502 (shown as Pt/FTO). The photoelectrode and counter-electrode are combined, sandwiching the various layers 1502-1506 between the two substrate layers 1501 and 1507 as shown in FIG. 1, and allowing electrode layers 1502 and 1506 to be utilized as a cathode and anode, respectively. A layer of electrolyte 1503 is deposited either directly onto the completed photoelectrode after dye layer 1504 or through an opening in the device, typically a hole pre-drilled by sand-blasting in the counter-electrode substrate 1501. The cell may also be attached to leads and a discharge unit, such as a battery (not shown). Substrate layer 1507 and electrode layer 1506, and/or substrate layer 1501 and electrode layer 1502 should be of sufficient transparency to permit solar radiation to pass through to the photoactive dye 1504. In some embodiments, the counter-electrode and/or photoelectrode may be rigid, while in others either or both may be flexible. The substrate layers of various embodiments may comprise any one or more of: glass, polymer, polyolefin, polyethylene, polypropylene, PEN, PET, PMMA, polycarbonate, Kapton, quartz, sapphire aluminum, silver foil, gold foil, wood, concrete, and steel. In certain embodiments, a DSSC may further include a light harvesting layer 1601, as shown in FIG. 2, to scatter incident light in order to increase the light's path length through the photoactive layer of the device (thereby increasing the likelihood the light is absorbed in the photoactive layer).

In other embodiments, the present disclosure provides solid state DSSCs. Solid-state DSSCs according to some embodiments may provide advantages such as lack of leakage and/or corrosion issues that may affect DSSCs comprising liquid electrolytes. Furthermore, a solid-state charge carrier may provide faster device physics (e.g., faster charge transport). Additionally, solid-state electrolytes may, in some embodiments, be photoactive and therefore contribute to power derived from a solid-state DSSC device.

Figure 5:
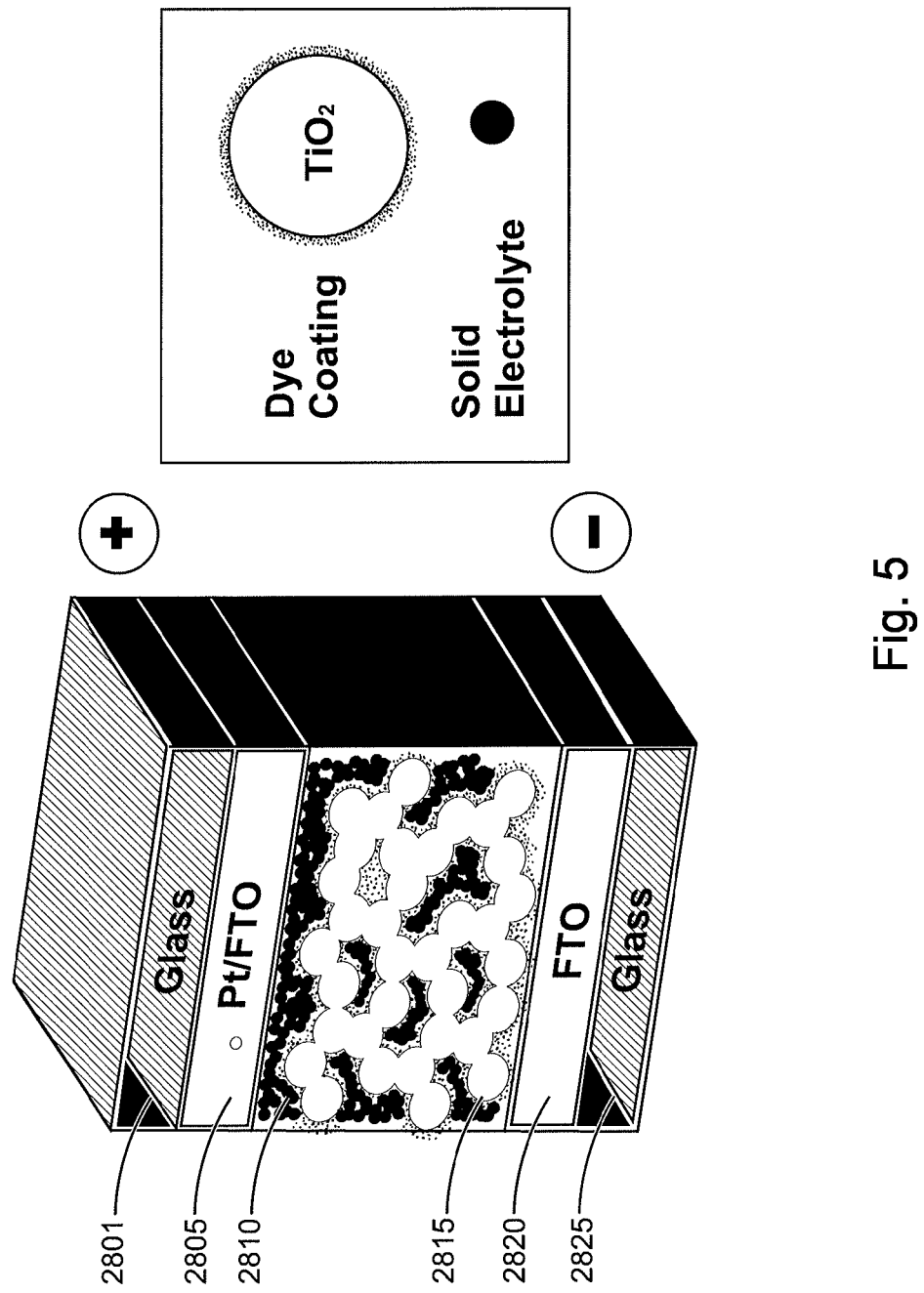
FIG. 5 is a schematic of a typical solid state DSSC device according to some embodiments of the present disclosure.

Some examples of solid state DSSCs may be described by reference to FIG. 5, which is a stylized schematic of a typical solid state DSSC. As with the example solar cell depicted in, e.g., FIG. 4, an active layer comprised of first and second active (e.g., conducting and/or semi-conducting) material (2810 and 2815, respectively) is sandwiched between electrodes 2805 and 2820 (shown in FIG. 5 as Pt/FTO and FTO, respectively). In the embodiment shown in FIG. 5, the first active material 2810 is p-type active material, and comprises a solid-state electrolyte. In certain embodiments, the first active material 2810 may comprise an organic material such as spiro-OMeTAD and/or poly(3-hexylthiophene), an inorganic binary, ternary, quaternary, or greater complex, any solid semiconducting material, or any combination thereof. In some embodiments, the first active material may additionally or instead comprise an oxide and/or a sulfide, and/or a selenide, and/or an iodide (e.g., $CsSnI_3$). Thus, for example, the first active material of some embodiments may comprise solid-state p-type material, which may comprise copper indium sulfide, and in some embodiments, it may comprise copper indium gallium selenide. The second active material 2815 shown in FIG. 5 is n-type active material and comprises $TiO_2$ coated with a dye. In some embodiments, the second active material may likewise comprise an organic material such as spiro-OMeTAD, an inorganic binary, ternary, quaternary, or greater complex, or any combination thereof. In some embodiments, the second active material may comprise an oxide such as alumina, and/or it may comprise a sulfide, and/or it may comprise a selenide. Thus, in some embodiments, the second active material may comprise copper indium sulfide, and in some embodiments, it may comprise copper indium gallium selenide. The second active material 2815 of some embodiments may constitute a mesoporous layer. Furthermore, in addition to being active, either or both of the first and second active materials 2810 and 2815 may be photoactive. In other embodiments (not shown in FIG. 5), the second active material may comprise a solid electrolyte. In addition, in embodiments where either of the first and second active material 2810 and 2815 comprise a solid electrolyte, the PV device may lack an effective amount of liquid electrolyte. Although shown and referred to in FIG. 5 as being p-type, a solid state layer (e.g., first active material comprising solid electrolyte) may in some embodiments instead be n-type semiconducting. In such embodiments, then, the second active material (e.g., $TiO_2$ (or other mesoporous material) as shown in FIG. 5) coated with a dye may be p-type semiconducting (as opposed to the n-type semiconducting shown in, and discussed with respect to, FIG. 5).

Substrate layers 2801 and 2825 (both shown in FIG. 5 as glass) form the respective external top and bottom layers of the example cell of FIG. 5. These layers may comprise any material of sufficient transparency to permit solar radiation to pass through to the active/photoactive layer comprising dye, first and second active and/or photoactive material 2810 and 2815, such as glass, polymer, polyolefin, polyethylene, polypropylene, PEN, PET, PMMA, polycarbonate, Kapton, quartz, sapphire, aluminum, aluminum foil, silver foil, gold foil, metal foil, wood, concrete, and steel. Furthermore, in the embodiment shown in FIG. 5, electrode 2805 (shown as Pt/FTO) is the cathode, and electrode 2820 is the anode. As with the example solar cell depicted in FIG. 4, solar radiation passes through substrate layer 2825 and electrode 2820 into the active layer, whereupon at least a portion of the solar radiation is absorbed so as to produce one or more excitons to enable electrical generation.

A solid state DSSC according to some embodiments may be constructed in a substantially similar manner to that described above with respect to the DSSC depicted as stylized in FIG. 1. In the embodiment shown in FIG. 5, p-type active material 2810 corresponds to electrolyte 1503 of FIG. 1; n-type active material 2815 corresponds to both dye 1504 and ML 1505 of FIG. 1; electrodes 2805 and 2820 respectively correspond to electrode layers 1502 and 1506 of FIG. 1; and substrate layers 2801 and 2825 respectively correspond to substrate layers 1501 and 1507.

Various embodiments of the present disclosure provide improved materials and/or designs in various aspects of solar cell and other devices, including among other things, active materials (including hole-transport and/or electron-transport layers), interfacial layers, and overall device design.

Interfacial Layers

The present disclosure, in some embodiments, provides advantageous materials and designs of one or more interfacial layers within a PV, including thin-coat IFLs. Thin-coat IFLs may be employed in one or more IFLs of a PV according to various embodiments discussed herein.

According to various embodiments, devices may optionally include an interfacial layer between any two other layers and/or materials, although devices need not contain any interfacial layers. For example, a perovskite material device may contain zero, one, two, three, four, five, or more interfacial layers (such as the example device of FIG. 9, which contains five interfacial layers 3903, 3905, 3907, 3909, and 3911). An interfacial layer may include any suitable material for enhancing charge transport and/or collection between two layers or materials; it may also help prevent or reduce the likelihood of charge recombination once a charge has been transported away from one of the materials adjacent to the interfacial layer. An interfacial layer may additionally physically and electrically homogenize its substrates to create variations in substrate roughness, dielectric constant, adhesion, creation or quenching of defects (e.g., charge traps, surface states). Suitable interfacial materials may include any one or more of: Ag; Al; Au; B; Bi; Ca; Cd; Ce; Co; Cu; Fe; Ga; Ge; H; In; Mg; Mn; Mo; Nb; Ni; Pt; Sb; Sc; Si; Sn; Ta; Ti; V; W; Y; Zn; Zr; carbides of any of the foregoing metals (e.g., SiC, $Fe_3C$, WC); silicides of any of the foregoing metals (e.g., $Mg_2Si$, $SrSi_2$, $Sn_2Si$); oxides of any of the foregoing metals (e.g., alumina, silica, titania, $SnO_2$, ZnO); sulfides of any of the foregoing metals (e.g., CdS, $MoS_2$, $SnS_2$); nitrides of any of the foregoing metals (e.g., $Mg_3N_2$, TiN, BN, $Si_3N_4$); selenides of any of the foregoing metals (e.g., CdSe, $FeS_2$, ZnSe); tellurides of any of the foregoing metals (e.g., CdTe, $TiTe_2$, ZnTe); phosphides of any of the foregoing metals (e.g., InP, GaP); arsenides of any of the foregoing metals (e.g., $CoAs_3$, GaAs, InGaAs, NiAs); antimonides of any of the foregoing metals (e.g., AlSb, GaSb, InSb); halides of any of the foregoing metals (e.g., CuCl, CuI, $BiI_3$); pseudohalides of any of the foregoing metals (e.g., CuSCN, AuCN); carbonates of any of the foregoing metals (e.g., $CaCO_3$, $Ce_2(CO_3)_3$); functionalized or non-functionalized alkyl silyl groups; graphite; graphene; fullerenes; carbon nanotubes; any mesoporous material and/or interfacial material discussed elsewhere herein; and combinations thereof (including, in some embodiments, bilayers, trilayers, or multilayers of combined materials). In some embodiments, an interfacial layer may include perovskite material. Further, interfacial layers may comprise doped embodiments of any interfacial material mentioned herein (e.g., Y-doped ZnO, N-doped single-wall carbon nanotubes). Interfacial layers may also comprise a compound having three of the above materials (e.g., $CuTiO_3$, $Zn_2SnO_4$) or a compound having four of the above materials (e.g., CoNiZnO).

First, as previously noted, one or more IFLs (e.g., either or both IFLs 2626 and 2627 as shown in FIG. 4) may comprise a photoactive organic compound of the present disclosure as a self-assembled monolayer (SAM) or as a thin film. When a photoactive organic compound of the present disclosure is applied as a SAM, it may comprise a binding group through which it may be covalently or otherwise bound to the surface of either or both of the anode and cathode. The binding group of some embodiments may comprise any one or more of COOH, $SiX_3$ (where X may be any moiety suitable for forming a ternary silicon compound, such as $Si(OR)_3$ and $SiCl_3$), $SO_3$, $PO_4H$, OH, $CH_2X$ (where X may comprise a Group 17 halide), and O. The binding group may be covalently or otherwise bound to an electron-withdrawing moiety, an electron donor moiety, and/or a core moiety. The binding group may attach to the electrode surface in a manner so as to form a directional, organized layer of a single molecule (or, in some embodiments, multiple molecules) in thickness (e.g., where multiple photoactive organic compounds are bound to the anode and/or cathode). As noted, the SAM may attach via covalent interactions, but in some embodiments it may attach via ionic, hydrogen-bonding, and/or dispersion force (i,e., Van Der Waals) interactions. Furthermore, in certain embodiments, upon light exposure, the SAM may enter into a zwitterionic excited state, thereby creating a highly-polarized IFL, which may direct charge carriers from an active layer into an electrode (e.g., either the anode or cathode). This enhanced charge-carrier injection may, in some embodiments, be accomplished by electronically poling the cross-section of the active layer and therefore increasing charge-carrier drift velocities towards their respective electrode (e.g., hole to anode; electrons to cathode). Molecules for anode applications of some embodiments may comprise tunable compounds that include a primary electron donor moiety bound to a core moiety, which in turn is bound to an electron-withdrawing moiety, which in turn is bound to a binding group. In cathode applications according to some embodiments, IFL molecules may comprise a tunable compound comprising an electron poor moiety bound to a core moiety, which in turn is bound to an electron donor moiety, which in turn is bound to a binding group. When a photoactive organic compound is employed as an IFL according to such embodiments, it may retain photoactive character, although in some embodiments it need not be photoactive.

In addition or instead of a photoactive organic compound SAM IFL, a PV according to some embodiments may include a thin interfacial layer (a "thin-coat interfacial layer" or "thin-coat IFL") coated onto at least a portion of either the first or the second active material of such embodiments (e.g., first or second active material 2810 or 2815 as shown in FIG. 5). And, in turn, at least a portion of the thin-coat IFL may be coated with a dye. The thin-coat IFL may be either n- or p-type; in some embodiments, it may be of the same type as the underlying material (e.g., $TiO_2$ or other mesoporous material, such as $TiO_2$ of second active material 2815). The second active material may comprise $TiO_2$ coated with a thin-coat IFL comprising alumina (e.g., $Al_2O_3$) (not shown in FIG. 5), which in turn is coated with a dye. References herein to $TiO_2$ and/or titania are not intended to limit the ratios of titanium and oxide in such titanium-oxide compounds described herein. That is, a titania compound may comprise titanium in any one or more of its various oxidation states (e.g., titanium I, titanium II, titanium III, titanium IV), and thus various embodiments may include stoichiometric and/or non-stoichiometric amounts of titanium and oxide. Thus, various embodiments may include (instead or in addition to $TiO_2$) $Ti_xO_y$, where x may be any value, integer or non-integer, between 1 and 100. In some embodiments, x may be between approximately 0.5 and 3. Likewise, y may be between approximately 1.5 and 4 (and, again, need not be an integer). Thus, some embodiments may include, e.g., $TiO_2$ and/or $Ti_2O_3$. In addition, titania in whatever ratios or combination of ratios between titanium and oxide may be of any one or more crystal structures in some embodiments, including any one or more of anatase, rutile, and amorphous.

Other example metal oxides for use in the thin-coat IFL of some embodiments may include semiconducting metal oxides, such as NiO, $WO_3$, $V_2O_5$, or $MoO_3$. The embodiment wherein the second (e.g., n-type) active material comprises $TiO_2$ coated with a thin-coat IFL comprising $Al_2O_3$ could be formed, for example, with a precursor material such as $Al(NO_3)_3 \cdot xH_2O$, or any other material suitable for depositing $Al_2O_3$ onto the $TiO_2$, followed by thermal annealing and dye coating. In example embodiments wherein a $MoO_3$ coating is instead used, the coating may be formed with a precursor material such as $Na_2Mo_4 \cdot 2H_2O$; whereas a $V_2O_5$ coating according to some embodiments may be formed with a precursor material such as $NaVO_3$; and a $WO_3$ coating according to some embodiments may be formed with a precursor material such as $NaWO_4 \cdot H_2O$. The concentration of precursor material (e.g., $Al(NO_3)_3 \cdot xH_2O$) may affect the final film thickness (here, of $Al_2O_3$) deposited on the $TiO_2$ or other active material. Thus, modifying the concentration of precursor material may be a method by which the final film thickness may be controlled. For example, greater film thickness may result from greater precursor material concentration. Greater film thickness may not necessarily result in greater PCE in a PV device comprising a metal oxide coating. Thus, a method of some embodiments may include coating a $TiO_2$ (or other mesoporous) layer using a precursor material having a concentration in the range of approximately 0.5 to 10.0 mM; other embodiments may include coating the layer with a precursor material having a concentration in the range of approximately 2.0 to 6.0 mM; or, in other embodiments, approximately 2.5 to 5.5 mM.

Furthermore, although referred to herein as $Al_2O_3$ and/or alumina, it should be noted that various ratios of aluminum and oxygen may be used in forming alumina. Thus, although some embodiments discussed herein are described with reference to $Al_2O_3$, such description is not intended to define a required ratio of aluminum in oxygen. Rather, embodiments may include any one or more aluminum-oxide compounds, each having an aluminum oxide ratio according to $Al_xO_y$, where x may be any value, integer or non-integer, between approximately 1 and 100. In some embodiments, x may be between approximately 1 and 3 (and, again, need not be an integer). Likewise, y may be any value, integer or non-integer, between 0.1 and 100. In some embodiments, y may be between 2 and 4 (and, again, need not be an integer). In addition, various crystalline forms of $Al_xO_y$ may be present in various embodiments, such as alpha, gamma, and/or amorphous forms of alumina.

Likewise, although referred to herein as $MoO_3$, $WO_3$, and $V_2O_5$, such compounds may instead or in addition be represented as $Mo_xO_y$, $W_xO_y$, and $V_xO_y$, respectively. Regarding each of $Mo_xO_y$ and $W_xO_y$, x may be any value, integer or non-integer, between approximately 0.5 and 100; in some embodiments, it may be between approximately 0.5 and 1.5. Likewise, y may be any value, integer or non-integer, between approximately 1 and 100. In some embodiments, y may be any value between approximately 1 and 4. Regarding $V_xO_y$, x may be any value, integer or non-integer, between approximately 0.5 and 100; in some embodiments, it may be between approximately 0.5 and 1.5. Likewise, y may be any value, integer or non-integer, between approximately 1 and 100; in certain embodiments, it may be an integer or non-integer value between approximately 1 and 10.

Similarly, references in some illustrative embodiments herein to $CsSnI_3$ are not intended to limit the ratios of component elements in the cesium-tin-iodine compounds according to various embodiments. Some embodiments may include stoichiometric and/or non-stoichiometric amounts of tin and iodide, and thus such embodiments may instead or in addition include various ratios of cesium, tin, and iodine, such as any one or more cesium-tin-iodine compounds, each having a ratio of $Cs_xSn_yI_z$. In such embodiments, x may be any value, integer or non-integer, between 0.1 and 100. In some embodiments, x may be between approximately 0.5 and 1.5 (and, again, need not be an integer). Likewise, y may be any value, integer or non-integer, between 0.1 and 100. In some embodiments, y may be between approximately 0.5 and 1.5 (and, again, need not be an integer). Likewise, z may be any value, integer or non-integer, between 0.1 and 100. In some embodiments, z may be between approximately 2.5 and 3.5. Additionally $CsSnI_3$ may be doped or compounded with other materials, such as $SnF_2$, in ratios of $CsSnI_3:SnF_2$ ranging from 0.1:1 to 100:1, including all values (integer and non-integer) in between.

In addition, a thin-coat IFL may comprise a bilayer. Thus, returning to the example wherein the thin-coat IFL comprises a metal-oxide (such as alumina), the thin-coat IFL may comprise $TiO_2$-plus-metal-oxide. Such a thin-coat IFL may have a greater ability to resist charge recombination as compared to mesoporous $TiO_2$ or other active material alone. Furthermore, in forming a $TiO_2$ layer, a secondary $TiO_2$ coating is often necessary in order to provide sufficient physical interconnection of $TiO_2$ particles, according to some embodiments of the present disclosure. Coating a bilayer thin-coat IFL onto mesoporous $TiO_2$ (or other mesoporous active material) may comprise a combination of coating using a compound comprising both metal oxide and $TiCl_4$, resulting in an bilayer thin-coat IFL comprising a combination of metal-oxide and secondary $TiO_2$ coating, which may provide performance improvements over use of either material on its own.

In some embodiments, the IFL may comprise a titanate. A titanate according to some embodiments may be of the general formula M'$TiO_3$, where: M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of titanate, which in other embodiments, the IFL may comprise two or more different species of titanates. In one embodiment, the titanate has the formula $SrTiO_3$. In another embodiment, the titanate may have the formula $BaTiO_3$. In yet another embodiment, the titanate may have the formula $CaTiO_3$.

By way of explanation, and without implying any limitation, titanates have a perovskite crystalline structure and strongly seed the perovskite material (e.g., $MAPbI_3$, $FAPbI_3$) growth conversion process. Titanates generally also meet other IFL requirements, such as ferroelectric behavior, sufficient charge carrier mobility, optical transparency, matched energy levels, and high dielectric constant.

In other embodiments, the IFL may comprise a zirconate. A zirconate according to some embodiments may be of the general formula M'$ZrO_3$, where: M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of zirconate, which in other embodiments, the IFL may comprise two or more different species of zirconate. In one embodiment, the zirconate has the formula $SrZrO_3$. In another embodiment, the zirconate may have the formula $BaZrO_3$. In yet another embodiment, the zirconate may have the formula $CaZrO_3$.

By way of explanation, and without implying any limitation, zirconate have a perovskite crystalline structure and strongly seed the perovskite material (e.g., $MAPbI_3$, $FAPbI_3$) growth conversion process. Zirconates generally also meet other IFL requirements, such as ferroelectric behavior, sufficient charge carrier mobility, optical transparency, matched energy levels, and high dielectric constant.

Further, in other embodiments, an IFL may comprise a combination of a zirconate and a titanate in the general formula M'[$Zr_xTi_{1-x}$]$O_3$, where X is greater than 0 but less than one 1, and M' comprises any 2+ cation. In some embodiments, M' may comprise a cationic form of Be, Mg, Ca, Sr, Ba, Ni, Zn, Cd, Hg, Cu, Pd, Pt, Sn, or Pb. In some embodiments, the IFL may comprise a single species of zirconate, which in other embodiments, the IFL may comprise two or more different species of zirconate. In one embodiment, the zirconate/titanate combination has the formula Pb[$Zr_xTi_{1-x}$]$O_3$. In another embodiment, the zirconate/titanate combination has the formula Pb[$Zr_{0.52}Ti_{0.48}$]$O_3$.

By way of explanation, and without implying any limitation, a zirconate/titanate combination have a perovskite crystalline structure and strongly seed the perovskite material (e.g., $MAPbI_3$, $FAPbI_3$) growth conversion process. Zirconate/titanate combinations generally also meet other IFL requirements, such as ferroelectric behavior, sufficient charge carrier mobility, optical transparency, matched energy levels, and high dielectric constant.

In other embodiments, the IFL may comprise a niobate. A niobate according to some embodiments may be of the general formula M'$NiO_3$, where: M' comprises any 1+ cation. In some embodiments, M' may comprise a cationic form of Li, Na, K, Rb, Cs, Cu, Ag, Au, Tl, ammonium, or H. In some embodiments, the IFL may comprise a single species of niobate, which in other embodiments, the IFL may comprise two or more different species of niobate. In one embodiment, the niobate has the formula $LiNbO_3$. In another embodiment, the niobate may have the formula $NaNbO_3$. In yet another embodiment, the niobate may have the formula $AgNbO_3$.

By way of explanation, and without implying any limitation, niobates generally meet IFL requirements, such as piezoelectric behavior, non-linear optical polarizability, photoelasticity, ferroelectric behavior, Pockels effect, sufficient charge carrier mobility, optical transparency, matched energy levels, and high dielectric constant.

In one embodiment, a perovskite material device may be formulated by casting $PbI_2$ onto a $SrTiO_3$-coated ITO substrate. The $PbI_2$ may be converted to $MAPbI_3$ by a dipping process. This process is described in greater detail below. This resulting conversion of $PbI_2$ to $MAPbI_3$ is more complete (as observed by optical spectroscopy) as compared to the preparation of the substrate without $SrTiO_3$.

Any interfacial material discussed herein may further comprise doped compositions. To modify the characteristics (e.g., electrical, optical, mechanical) of an interfacial material, a stoichiometric or non-stoichiometric material may be doped with one or more elements (e.g., Na, Y, Mg, N, P) in amounts ranging from as little as 1 ppb to 50 mol %. Some examples of interfacial materials include: NiO, $TiO_2$, $SrTiO_3$, $Al_2O_3$, $ZrO_2$, $WO_3$, $V_2O_5$, $MO_3$, ZnO, graphene, and carbon black. Examples of possible dopants for these interfacial materials include: Li, Na, Be, Mg, Ca, Sr, Ba, Sc, Y, Nb, Ti, Fe, Co, Ni, Cu, Ga, Sn, In, B, N, P, C, S, As, a halide, a pseudohalide (e.g., cyanide, cyanate, isocyanate, fulminate, thiocyanate, isothiocyanate, azide, tetracarbonylcobaltate, carbamoyldicyanomethanide, dicyanonitrosomethanide, dicyanamide, and tricyanomethanide), and Al in any of its oxidation states. References herein to doped interfacial materials are not intended to limit the ratios of component elements in interfacial material compounds.

The thin-coat IFLs and methods of coating them onto $TiO_2$ previously discussed may, in some embodiments, be employed in DSSCs comprising liquid electrolytes. Thus, returning to the example of a thin-coat IFL and referring back to FIG. 1 for an example, the DSSC of FIG. 1 could further comprise a thin-coat IFL as described above coated onto the mesoporous layer 1505 (that is, the thin-coat IFL would be inserted between mesoporous layer 1505 and dye 1504).

In some embodiments, the thin-coat IFLs previously discussed in the context of DSSCs may be used in any interfacial layer of a semiconductor device such as a PV (e.g., a hybrid PV or other PV), field-effect transistor, light-emitting diode, non-linear optical device, memristor, capacitor, rectifier, rectifying antenna, etc. Furthermore, thin-coat IFLs of some embodiments may be employed in any of various devices in combination with other compounds discussed in the present disclosure, including but not limited to any one or more of the following of various embodiments of the present disclosure: solid hole-transport material such as active material and additives (such as, in some embodiments, chenodeoxycholic acid or 1,8-diiodooctane).

In some embodiments, multiple IFLs made from different materials may be arranged adjacent to each other to form a composite IFL. This configuration may involve two different IFLs, three different IFLs, or an even greater number of different IFLs. The resulting multi-layer IFL or composite IFL may be used in lieu of a single-material IFL. For example, a composite IFL may be used as IFL 2626 and/or as IFL 2627 in cell 2610, shown in the example of FIG. 4. While the composite IFL differs from a single-material IFL, the assembly of a perovskite material PV cell having multi-layer IFLs is not substantially different than the assembly of a perovskite material PV cell having only single-material IFLs.

Generally, the composite IFL may be made using any of the materials discussed herein as suitable for an IFL. In one embodiment, the IFL comprises a layer of $Al_2O_3$ and a layer of ZnO or M:ZnO (doped ZnO, e.g., Be:ZnO, Mg:ZnO, Ca:ZnO, Sr:ZnO, Ba:ZnO, Sc:ZnO, Y:ZnO, Nb:ZnO). In an embodiment, the IFL comprises a layer of $ZrO_2$ and a layer of ZnO or M:ZnO. In certain embodiments, the IFL comprises multiple layers. In some embodiments, a multi-layer IFL generally has a conductor layer, a dielectric layer, and a semi-conductor layer. In particular embodiments the layers may repeat, for example, a conductor layer, a dielectric layer, a semi-conductor layer, a dielectric layer, and a semi-conductor layer. Examples of multi-layer IFLs include an IFL having an ITO layer, an $Al_2O_3$ layer, a ZnO layer, and a second $Al_2O_3$ layer; an IFL having an ITO layer, an $Al_2O_3$ layer, a ZnO layer, a second $Al_2O_3$ layer, and a second ZnO layer; an IFL having an ITO layer, an $Al_2O_3$ layer, a ZnO layer, a second $Al_2O_3$ layer, a second ZnO layer, and a third $Al_2O_3$ layer; and IFLs having as many layers as necessary to achieve the desired performance characteristics. As discussed previously, references to certain stoichiometric ratios are not intended to limit the ratios of component elements in IFL layers according to various embodiments.

Arranging two or more adjacent IFLs as a composite IFL may outperform a single IFL in perovskite material PV cells where attributes from each IFL material may be leveraged in a single IFL. For example, in the architecture having an ITO layer, an $Al_2O_3$ layer, and a ZnO layer, where ITO is a conducting electrode, $Al_2O_3$ is a dielectric material and ZnO is a n-type semiconductor, ZnO acts as an electron acceptor with well performing electron transport properties (e.g., mobility). Additionally, $Al_2O_3$ is a physically robust material that adheres well to ITO, homogenizes the surface by capping surface defects (e.g., charge traps), and improves device diode characteristics through suppression of dark current.

Perovskite Material

A perovskite material may be incorporated into one or more aspects of a PV or other device. A perovskite material according to some embodiments may be of the general formula $C_wM_yX_z$, where: C comprises one or more cations (e.g., an amine, ammonium, a Group 1 metal, a Group 2 metal, and/or other cations or cation-like compounds); M comprises one or more metals (examples including Fe, Co, Ni, Cu, Ag, Au, Tl, In, Sb, Sn, Pb, Bi, Ga, Ge, Ti, and Zn); X comprises one or more anions; and w, y, and z represent real numbers between 1 and 20. In some embodiments, C may include one or more organic cations. In some embodiments, each organic cation C may be larger than each metal M, and each anion X may be capable of bonding with both a cation C and a metal M. In particular embodiments, a perovskite material may be of the formula $CMX_3$.

In certain embodiments, C may include an ammonium, an organic cation of the general formula $[NR_4]^+$ where the R groups may be the same or different groups. Suitable R groups include, but are not limited to: methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OCxHy, where x=0-20, y=1-42.

In certain embodiments, C may include a formamidinium, an organic cation of the general formula $[R_2NCRNR_2]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OCxHy, where x=0-20, y=1-42.

Formula 1

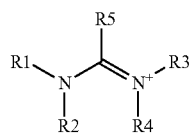

Formula 1 illustrates the structure of a formamidinium cation having the general formula of $[R_2NCRNR_2]^+$ as described above. Formula 2 illustrates examples structures of several formamidinium cations that may serve as a cation "C" in a perovskite material.

Formula 2

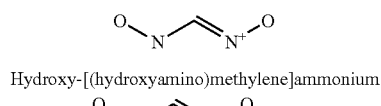

Hydroxy-[(hydroxyamino)methylene]ammonium

Methyl(methylaminomethylene)ammonium

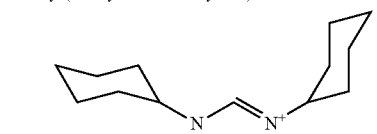

Cyclohexyl-[(cyclohexylamino)methylene]ammonium

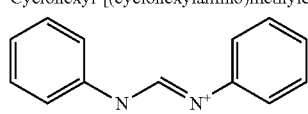

Anilinomethylene(phenyl)ammonium

-continued

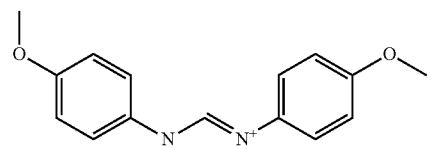

(Methoxyanilino)methylene-(4-methoxyphenyl)ammonium

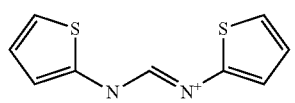

Thienyl-[(2-thienylamino)methylene]ammonium

In certain embodiments, C may include a guanidinium, an organic cation of the general formula $[(R_2N)_2C=NR_2]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OCxHy, where x=0-20, y=1-42.

Formula 3

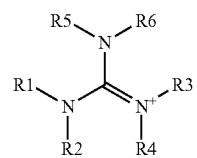

Formula 3 illustrates the structure of a guanidinium cation having the general formula of $[(R_2N)_2C=NR_2]^+$ as described above. Formula 4 illustrates examples of structures of several guanidinium cations that may serve as a cation "C" in a perovskite material.

Formula 4

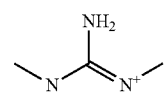 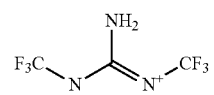

[Amino(methylamino)methylene]-methyl-ammonium

[Amino-(trifluoromethylamino)methylene]-(trifluoromethyl)ammonium

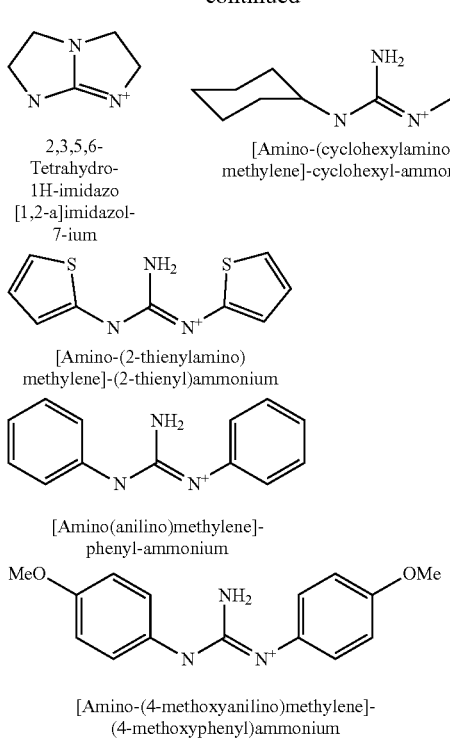

2,3,5,6-Tetrahydro-1H-imidazo[1,2-a]imidazol-7-ium

[Amino-(cyclohexylamino)methylene]-cyclohexyl-ammonium

[Amino-(2-thienylamino)methylene]-(2-thienyl)ammonium

[Amino(anilino)methylene]-phenyl-ammonium

[Amino-(4-methoxyanilino)methylene]-(4-methoxyphenyl)ammonium

In certain embodiments, C may include an ethene tetramine cation, an organic cation of the general formula $[(R_2N)_2C=C(NR_2)_2]^+$ where the R groups may be the same or different groups. Suitable R groups include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., 2-hexahydropyrimidin-2-ylidenehexahydropyrimidine, octahydropyrazino[2,3-b]pyrazine, pyrazino[2,3-b]pyrazine, quinoxalino[2,3-b]quinoxaline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OCxHy, where x=0-20, y=1-42.

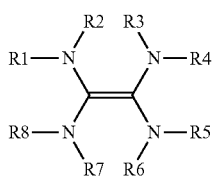

Formula 5

Formula 5 illustrates the structure of an ethene tetramine cation having the general formula of $[(R_2N)_2C=C(NR_2)_2]^+$ as described above. Formula 6 illustrates examples of structures of several ethene tetramine ions that may serve as a cation "C" in a perovskite material.

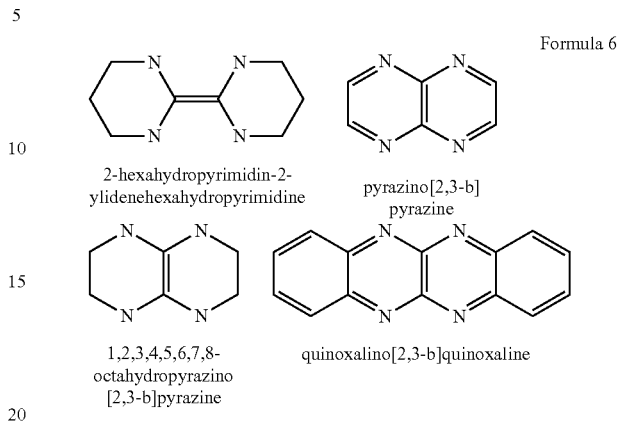

Formula 6

2-hexahydropyrimidin-2-ylidenehexahydropyrimidine pyrazino[2,3-b]pyrazine 1,2,3,4,5,6,7,8-octahydropyrazino[2,3-b]pyrazine quinoxalino[2,3-b]quinoxaline In certain embodiments, C may include an imidazolium cation, an aromatic, cyclic organic cation of the general formula [CRNRCRNRCR]+ where the R groups may be the same or different groups. Suitable R groups may include, but are not limited to: hydrogen, methyl, ethyl, propyl, butyl, pentyl group or isomer thereof; any alkane, alkene, or alkyne CxHy, where x=1-20, y=1-42, cyclic, branched or straight-chain; alkyl halides, CxHyXz, x=1-20, y=0-42, z=1-42, X=F, Cl, Br, or I; any aromatic group (e.g., phenyl, alkylphenl, alkoxyphenyl, pyridine, naphthalene); cyclic complexes where at least one nitrogen is contained within the ring (e.g., 2-hexahydropyrimidin-2-ylidenehexahydropyrimidine, octahydropyrazino[2,3-b]pyrazine, pyrazino[2,3-b]pyrazine, quinoxalino[2,3-b]quinoxaline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —OCxHy, where x=0-20, y=1-42.

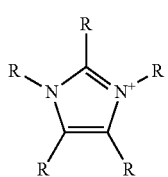

Formula 7

In some embodiments, X may include one or more halides. In certain embodiments, X may instead or in addition include a Group 16 anion. In certain embodiments, the Group 16 anion may be oxide, sulfide, selenide, or telluride. In certain embodiments, X may instead or in addition include one or more a pseudohalides (e.g., cyanide, cyanate, isocyanate, fulminate, thiocyanate, isothiocyanate, azide, tetracarbonylcobaltate, carbamoyldicyanomethanide, dicyanonitrosomethanide, dicyanamide, and tricyanomethanide).

In one embodiment, a perovskite material may comprise the empirical formula $CMX_3$ where: C comprises one or more of the aforementioned cations, a Group 1 metal, a Group 2 metal, and/or other cations or cation-like compounds; M comprises one or more metals (examples including Fe, Co, Ni, Cu, Ag, Au, Sb, Sn, Pb, Bi, Ga, Ge, Ti, Tl, and Zn); and X comprises one or more of the aforementioned anions.

In one embodiment, a perovskite material may comprise the empirical formula $C_3M_2X_9$ where: C comprises one or more of the aforementioned cations, a Group 1 metal, a Group 2 metal, and/or other cations or cation-like compounds; M comprises one or more metals (examples including Fe, Co, Ni, Cu, Ag, Au, Sb, Sn, Pb, Bi, Ga, Ge, Ti, Tl, and Zn); and X comprises one or more of the aforementioned anions.

In one embodiment, a perovskite material may comprise the empirical formula $CM_2X_7$ where: C comprises one or more of the aforementioned cations, a Group 1 metal, a Group 2 metal, and/or other cations or cation-like compounds; M comprises one or more metals (examples including Fe, Co, Ni, Cu, Ag, Au, Sb, Sn, Pb, Bi, Ga, Ge, Ti, Tl, and Zn); and X comprises one or more of the aforementioned anions.

In one embodiment, a perovskite material may comprise the empirical formula $C_2MX_4$ where: C comprises one or more of the aforementioned cations, a Group 1 metal, a Group 2 metal, and/or other cations or cation-like compounds; M comprises one or more metals (examples including Fe, Co, Ni, Cu, Ag, Au, Sb, Sn, Pb, Bi, Ga, Ge, Ti, Tl, and Zn); and X comprises one or more of the aforementioned anions.

Perovskite materials may also comprise mixed ion formulations where C, M, or X comprise two or more species, for example, $Cs_{0.1}FA_{0.9}PbI_3$; $FAPb_{0.5}Sn_{0.5}I_3$; $FA_{0.83}Cs_{0.17}Pb(I_{0.6}Br_{0.4})_3$; $FA_{0.83}Cs_{0.12}Rb_{0.05}Pb(I_{0.6}Br_{0.4})_3$ and $FA_{0.85}MA_{0.15}Pb(I_{0.85}Br_{0.15})_3$.

Examples of perovskite materials according to various embodiments include $CsSnI_3$ (previously discussed herein) and $Cs_xSn_yI_z$ (with x, y, and z varying in accordance with the previous discussion). Other examples include compounds of the general formula $CsSnX_3$, where X may be any one or more of: $I_3$, $I_{2.95}F_{0.05}$; $I_2Cl$; $ICl_2$; and $Cl_3$. In other embodiments, X may comprise any one or more of I, Cl, F, and Br in amounts such that the total ratio of X as compared to Cs and Sn results in the general stoichiometry of $CsSnX_3$. In some embodiments, the combined stoichiometry of the elements that constitute X may follow the same rules as $I_z$ as previously discussed with respect to $Cs_xSn_yI_z$. Yet other examples include compounds of the general formula $RNH_3PbX_3$, where R may be $C-H_{2n+1}$, with n ranging from 0-10, and X may include any one or more of F, Cl, Br, and I in amounts such that the total ratio of X as compared to the cation $RNH_3$ and metal Pb results in the general stoichiometry of $RNH_3PbX_3$. Further, some specific examples of R include H, alkyl chains (e.g., $CH_3$, $CH_3CH_2$, $CH_3CH_2CH_2$, and so on), and amino acids (e.g., glycine, cysteine, proline, glutamic acid, arginine, serine, histindine, 5-ammoniumvaleric acid) including alpha, beta, gamma, and greater derivatives.

Other Exemplar Electronic Devices

Another example device according to some embodiments is a monolithic thin-film PV and battery device, or hybrid PV battery.

Figure 6:
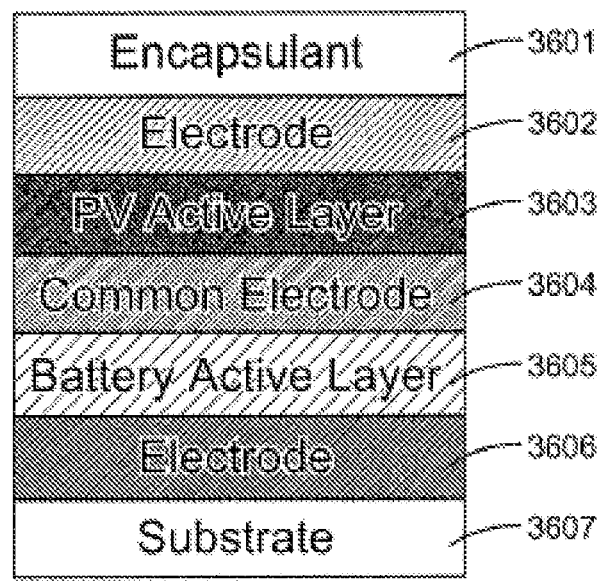
FIG. 6 is a depiction of components of an exemplar hybrid PV battery according to some embodiments of the present disclosure.

A hybrid PV battery according to some embodiments of the present disclosure may generally include a PV cell and a battery portion sharing a common electrode and electrically coupled in series or parallel. For example, hybrid PV batteries of some embodiments may be described by reference to FIG. 6, which is a stylized diagram of components of an exemplar hybrid PV battery, and includes: an encapsulant 3601; at least three electrodes 3602, 3604, and 3606, at least one of which is a common electrode (here 3604) shared by the PV portion of the device and the battery portion of the device; a PV active layer 3603; a battery active layer 3605; and a substrate 3607. In such example embodiments, the PV cell of the device may comprise one electrode 3602 (which may in some embodiments be referred to as a PV electrode) and the PV active layer 3603, while the battery of the device may comprise the other non-shared electrode 3606 (which may in some embodiments be referred to as a battery electrode) and the battery active layer 3605. The PV cell and the battery portion of such embodiments share the common electrode 3604. In some embodiments, the hybrid PV battery may be monolithic, that is, imprinted on a single substrate. In such embodiments, both the PV cell and the battery portion should be thin-film type devices. In some embodiments, both the PV cell and the battery may be capable of being printed by high-throughput techniques such as ink-jet, die-slot, gravure, and imprint roll-to-roll printing.

The PV cell of some embodiments may include a DSSC, a BHJ, a hybrid PV, or any other PV known in the art, such as cadmium telluride (CdTe) PVs, or CIGS (copper-indium-gallium-selenide) PVs. For example, in embodiments where the PV cell of a hybrid PV battery comprises a DSSC, the PV cell may be described by comparison between the exemplar liquid electrolyte DSSC of FIG. 1 and the PV cell of the exemplar hybrid PV battery of FIG. 6. Specifically, PV electrode 3602 may correspond to electrode layer 1502; PV active layer 3603 may correspond to electrolyte 1503, dye 1504, and ML 1505; and common electrode 3604 may correspond to electrode layer 1506. Any other PV may similarly correspond to the PV cell components of some embodiments of a hybrid PV battery, as will be apparent to one of ordinary skill in the art with the benefit of this disclosure. Furthermore, as with the PV devices discussed herein, the PV active layer within the PV cell of the device may in some embodiments comprise any one or more of: an interfacial layer, and first and/or second active material (each of which may be n-type or p-type semiconducting, and either or both of which may include a metal-oxide interfacial layer according to various embodiments discussed herein).

The battery portion of such devices may be composed according to batteries known in the art, such as lithium ion or zinc air. In some embodiments, the battery may be a thin-film battery.

Thus, for example, a hybrid PV battery according to some embodiments may include a DSSC integrated with a zinc-air battery. Both devices are thin-film type and are capable of being printed by high-throughput techniques such as ink-jet roll-to-roll printing, in accordance with some embodiments of the present disclosure. In this example, the zinc-air battery is first printed on a substrate (corresponding to substrate 3607) completed with counter-electrode. The battery counter-electrode then becomes the common electrode (corresponding to common electrode 3604) as the photoactive layer (corresponding to PV active layer 3603) is subsequently printed on the electrode 3604. The device is completed with a final electrode (corresponding to PV electrode 3602), and encapsulated in an encapsulant (corresponding to encapsulant 3601). The encapsulant may comprise epoxy, polyvinylidene fluoride (PVDF), ethyl-vinyl acetate (EVA), Parylene C, or any other material suitable for protecting the device from the environment.

In some embodiments, a hybrid PV battery may provide several advantages over known batteries or PV devices. In embodiments in which the hybrid PV battery is monolithic, it may exhibit increased durability due to the lack of connecting wires. The combination of two otherwise separate devices into one (PV and battery) further may advantageously reduce overall size and weight compared to use of a separate PV to charge a separate battery. In embodiments in which the hybrid PV battery comprises a thin-film type PV cell and battery portion, the thin-type PV cell may advantageously be capable of being printed in-line with a battery on substrates known to the battery industry, such as polyimides (e.g., Kapton or polyethylene terephthalate (PET)). In addition, the final form factor of such hybrid PV batteries may, in some embodiments, be made to fit form factors of standard batteries (e.g., for use in consumer electronics, such as coin, AAA, AA, C, D, or otherwise; or for use in, e.g., cellular telephones). In some embodiments, the battery could be charged by removal from a device followed by placement in sunlight. In other embodiments, the battery may be designed such that the PV cell of the battery is externally-facing from the device (e.g., the battery is not enclosed in the device) so that the device may be charged by exposure to sunlight. For example, a cellular telephone may comprise a hybrid PV battery with the PV cell of the battery facing the exterior of the phone (as opposed to placing the battery entirely within a covered portion of the phone).

In addition, some embodiments of the present disclosure may provide a multi-photoactive-layer PV cell. Such a cell may include at least two photoactive layers, each photoactive layer separated from the other by a shared double-sided conductive (i.e., conductor/insulator/conductor) substrate. The photoactive layers and shared substrate(s) of some embodiments may be sandwiched between conducting layers (e.g., conducting substrates, or conductors bound or otherwise coupled to a substrate). In some embodiments, any one or more of the conductors and/or substrates may be transparent to at least some electromagnetic radiation within the UV, visible, or IR spectrum.

Each photoactive layer may have a makeup in accordance with the active and/or photoactive layer(s) of any of the various PV devices discussed elsewhere herein (e.g., DSSC, BHJ, hybrid). In some embodiments, each photoactive layer may be capable of absorbing different wavelengths of electromagnetic radiation. Such configuration may be accomplished by any suitable means which will be apparent to one of ordinary skill in the art with the benefit of this disclosure.

Figure 7:
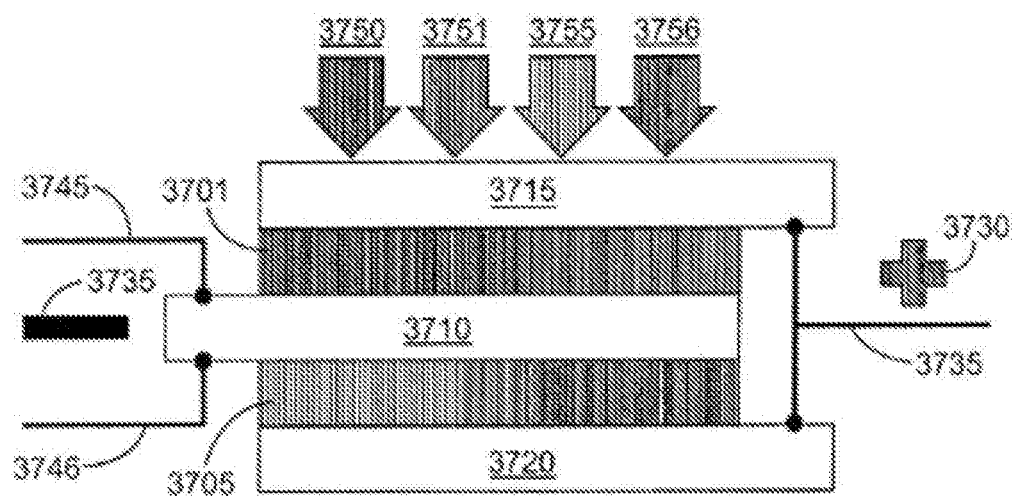
FIG. 7 is a stylized diagram illustrating components of an exemplar PV device according to some embodiments of the present disclosure.

An exemplary multi-photoactive-layer PV cell according to some embodiments may be described by reference to the stylized diagram of FIG. 7, which illustrates the basic structure of some such PV cells. FIG. 7 shows first and second photoactive layers (3701 and 3705, respectively) separated by a shared double-sided conductive substrate 3710 (e.g., FIG. 7 shows an architecture of the general nature conductor/insulator/conductor). The two photoactive layers 3701 and 3705, and the shared substrate 3710, are sandwiched between first and second conductive substrates 3715 and 3720. In this exemplary set-up, each photoactive layer 3701 and 3705 comprises a dye in accordance with a DSSC-like configuration. Further, the dye of the first photoactive layer 3701 is capable of absorbing electromagnetic radiation at a first portion of the visible EM spectrum (e.g., incident blue and green light 3750 and 3751), while the dye of the second photoactive layer 3705 is capable of absorbing electromagnetic radiation at a second, different, portion of the visible EM spectrum (e.g., red and yellow light 3755 and 3756). It should be noted that, while not the case in the device illustrated in FIG. 7, devices according to some embodiments may include dyes (or other photoactive layer materials) capable of absorbing radiation in ranges of wavelengths that, while different, nonetheless overlap. Upon excitation in each photoactive layer (e.g., by incident solar radiation), holes may flow from the first photoactive layer 3701 to the first conductive substrate 3715, and likewise from the second photoactive layer 3705 to the second conductive substrate 3720. Concomitant electron transport may accordingly take place from each photoactive layer 3701 and 3705 to the shared conductive substrate 3710. An electrical conductor or conductors (e.g., lead 3735 as in FIG. 7) may provide further transport of holes away from each of the first and second conductive substrates 3715 and 3720 toward a negative direction 3730 of the circuit (e.g., toward a cathode, negative battery terminal, etc.), while a conductor or conductors (e.g., leads 3745 and 3746 as in FIG. 7) may carry electrons away from the shared substrate 3710, toward a positive direction 3735 of the circuit.

In some embodiments, two or more multi-photoactive-layer PV cells may be connected or otherwise electrically coupled (e.g., in series). For example, referring back to the exemplary embodiment of FIG. 7, the wire 3735 conducting electrons away from each of the first and second conductive substrates 3715 and 3720 may in turn be connected to a double-sided shared conductive substrate of a second multi-photoactive-layer PV cell (e.g., a shared conductive substrate corresponding to shared conductive substrate 3710 of the exemplary PV cell of FIG. 7). Any number of PV cells may be so connected in series. The end effect in some embodiments is essentially multiple parallel PV cell pairs electrically coupled in series (wherein each multi-photoactive-layer PV cell with two photoactive layers and a shared double-sided conductive substrate could be considered a pair of parallel PV cells). Similarly, a multi-photoactive-layer PV cell with three photoactive layers and two shared double-sided conductive substrates sandwiched between each photoactive layer could equivalently be considered a trio of parallel PV cells, and so on for multi-photoactive-layer PV cells comprising four, five, and more photoactive layers.

Furthermore, electrically coupled multi-photoactive-layer PV cells may further be electrically coupled to one or more batteries to form a hybrid PV battery according to certain embodiments.

Figure 8A:
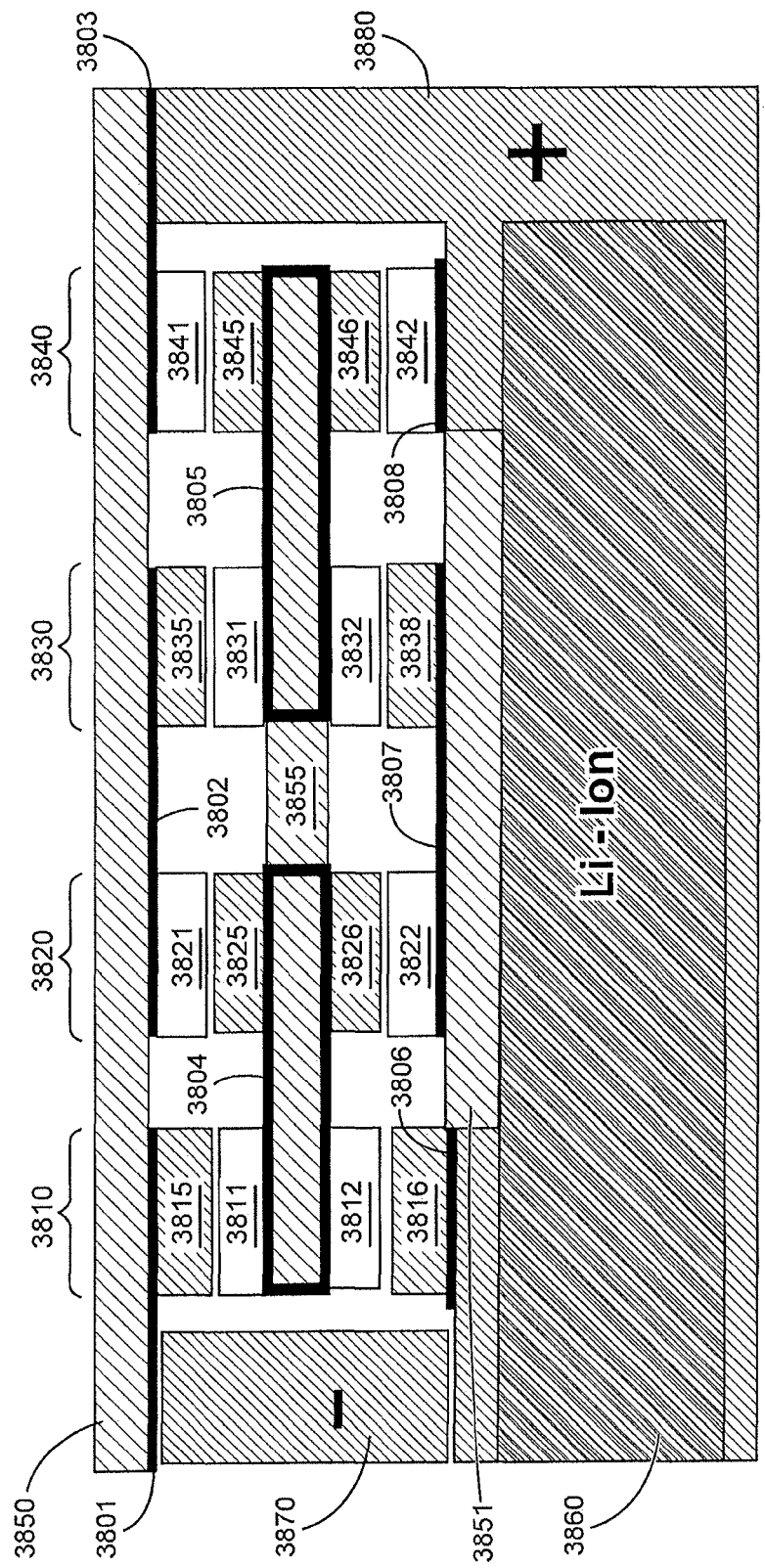
FIG. 8A is a stylized diagram illustrating a hybrid PV battery according to some embodiments of the present disclosure.
Figure 8B:
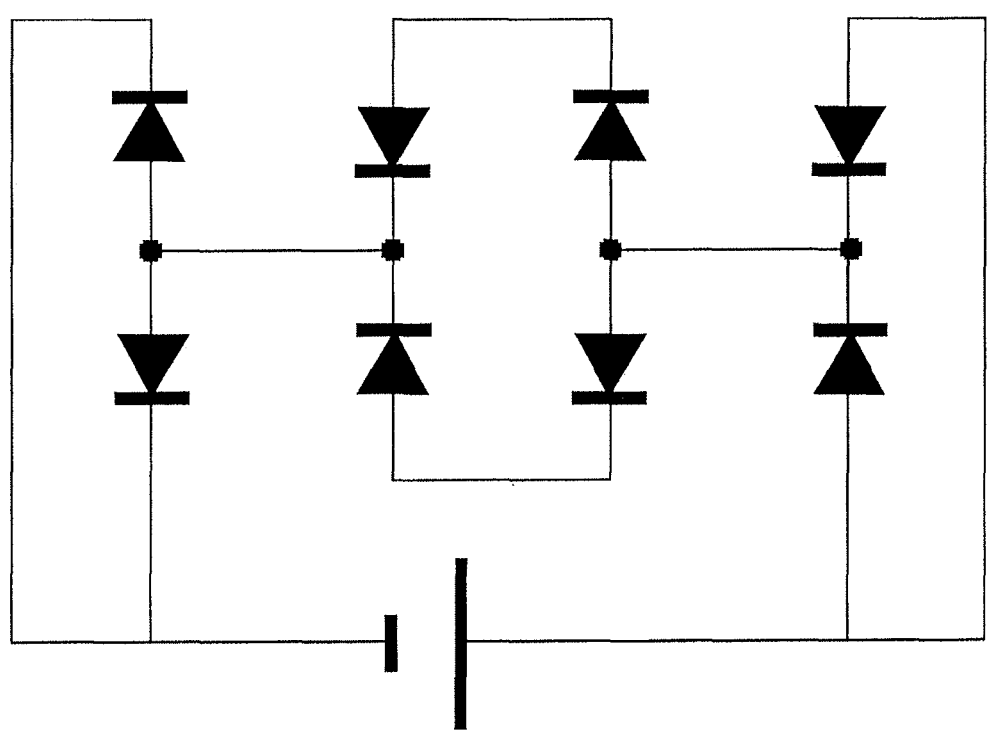
FIG. 8B is an electrical equivalent diagram relating to a hybrid PV battery according to some embodiments of the present disclosure.

In certain embodiments, the electrical coupling of two or more multi-photoactive-layer PV cells (e.g., series connection of two or more units of parallel PV cell pairs) in series may be carried out in a form similar to that illustrated in FIG. 8A, which depicts a series electrical coupling of four multi-photoactive-layer PV cells 3810, 3820, 3830, and 3840 between a capping anode 3870 and capping cathode 3880. The PV cells 3810, 3820, 3830, and 3840 have a common first outer substrate 3850, and PV cells 3820 and 3830 have a common second outer substrate 3851. In addition, a common shared substrate 3855 runs the length of the series connection, and for each PV cell corresponds to the shared substrate 3710 of the embodiment stylized in FIG. 8A. Each of the multi-photoactive-layer PV cells 3810, 3820, 3830, and 3840 shown in the embodiment of FIG. 8A includes two photoactive layers (e.g., photoactive layers 3811 and 3812 in PV cell 3810) and two photoelectrodes (e.g., photoelectrodes 3815 and 3816 in PV cell 3810). A photoactive layer according to this and other corresponding embodiments may include any photoactive and/or active material as disclosed hereinabove (e.g., first active material, second active material, and/or one or more interfacial layers), and a photoelectrode may include any substrate and/or conductive material suitable as an electrode as discussed herein. In some embodiments, the arrangement of photoactive layers and photoelectrodes may alternate from cell to cell (e.g., to establish electrical coupling in series). For example, as shown in FIG. 8A, cell 3810 is arranged between the shared outer substrates according to: photoelectrode-photoactive layer-shared substrate-photoactive layer-photoelectrode, while cell 3820 exhibits an arrangement wherein the photoelectrodes and photoactive layers are swapped relative to adjacent cell 3810, and cell 3830 likewise exhibits an arrangement wherein the photoelectrodes and photoactive layers are swapped relative to adjacent cell 3820 (and therefore arranged similarly to cell 3810). FIG. 8A additionally shows a plurality of transparent conductors (3801, 3802, 3803, 3804, 3805, 3806, 3807, and 3808) coupled to portions of each of the common substrates 3850, 3851, and 3855 so as to enable electrical coupling of the PV cells 3810, 3820, 3830, and 3840. In addition, FIG. 8A shows electrical coupling of the series of PV cells to a battery (here, Li-Ion battery 3860) in accordance with some embodiments. Such coupling may enable the PV cells to charge the Li-Ion battery in a similar fashion to the charging of hybrid PV-batteries of some embodiments previously discussed. FIG. 8B is an electrical equivalent diagram showing the resulting current flow in the device of FIG. 8A.

Composite Perovskite Material Device Design

In some embodiments, the present disclosure may provide composite design of PV and other similar devices (e.g., batteries, hybrid PV batteries, FETs, LEDs, nonlinear optics (NLOs), waveguides, etc.) including one or more perovskite materials. For example, one or more perovskite materials may serve as either or both of first and second active material of some embodiments (e.g., active materials 2810 and 2815 of FIG. 5). In more general terms, some embodiments of the present disclosure provide PV or other devices having an active layer comprising one or more perovskite materials. In such embodiments, perovskite material (that is, material including any one or more perovskite materials(s)) may be employed in active layers of various architectures. Furthermore, perovskite material may serve the function(s) of any one or more components of an active layer (e.g., charge transport material, mesoporous material, photoactive material, and/or interfacial material, each of which is discussed in greater detail below). In some embodiments, the same perovskite materials may serve multiple such functions, although in other embodiments, a plurality of perovskite materials may be included in a device, each perovskite material serving one or more such functions. In certain embodiments, whatever role a perovskite material may serve, it may be prepared and/or present in a device in various states. For example, it may be substantially solid in some embodiments. In other embodiments, it may be a solution (e.g., perovskite material may be dissolved in liquid and present in said liquid in its individual ionic subspecies); or it may be a suspension (e.g., of perovskite material particles). A solution or suspension may be coated or otherwise deposited within a device (e.g., on another component of the device such as a mesoporous, interfacial, charge transport, photoactive, or other layer, and/or on an electrode). Perovskite materials in some embodiments may be formed in situ on a surface of another component of a device (e.g., by vapor deposition as a thin-film solid). Any other suitable means of forming a solid or liquid layer comprising perovskite material may be employed.

In general, a perovskite material device may include a first electrode, a second electrode, and an active layer comprising a perovskite material, the active layer disposed at least partially between the first and second electrodes. In some embodiments, the first electrode may be one of an anode and a cathode, and the second electrode may be the other of an anode and cathode. An active layer according to certain embodiments may include any one or more active layer components, including any one or more of: charge transport material; liquid electrolyte; mesoporous material; photoactive material (e.g., a dye, silicon, cadmium telluride, cadmium sulfide, cadmium selenide, copper indium gallium selenide, gallium arsenide, germanium indium phosphide, semiconducting polymers, other photoactive materials)); and interfacial material. Any one or more of these active layer components may include one or more perovskite materials. In some embodiments, some or all of the active layer components may be in whole or in part arranged in sub-layers. For example, the active layer may comprise any one or more of: an interfacial layer including interfacial material; a mesoporous layer including mesoporous material; and a charge transport layer including charge transport material. In some embodiments, photoactive material such as a dye may be coated on, or otherwise disposed on, any one or more of these layers. In certain embodiments, any one or more layers may be coated with a liquid electrolyte. Further, an interfacial layer may be included between any two or more other layers of an active layer according to some embodiments, and/or between a layer and a coating (such as between a dye and a mesoporous layer), and/or between two coatings (such as between a liquid electrolyte and a dye), and/or between an active layer component and an electrode. Reference to layers herein may include either a final arrangement (e.g., substantially discrete portions of each material separately definable within the device), and/or reference to a layer may mean arrangement during construction of a device, notwithstanding the possibility of subsequent intermixing of material(s) in each layer. Layers may in some embodiments be discrete and comprise substantially contiguous material (e.g., layers may be as stylistically illustrated in FIG. 1). In other embodiments, layers may be substantially intermixed (as in the case of, e.g., BHJ, hybrid, and some DSSC cells), an example of which is shown by first and second active material 2618 and 2620 within photoactive layer 2616 in FIG. 4. In some embodiments, a device may comprise a mixture of these two kinds of layers, as is also shown by the device of FIG. 4, which contains discrete contiguous layers 2627, 2626, and 2622, in addition to a photoactive layer 2616 comprising intermixed layers of first and second active material 2618 and 2620. In any case, any two or more layers of whatever kind may in certain embodiments be disposed adjacent to each other (and/or intermixedly with each other) in such a way as to achieve a high contact surface area. In certain embodiments, a layer comprising perovskite material may be disposed adjacent to one or more other layers so as to achieve high contact surface area (e.g., where a perovskite material exhibits low charge mobility). In other embodiments, high contact surface area may not be necessary (e.g., where a perovskite material exhibits high charge mobility).

A perovskite material device according to some embodiments may optionally include one or more substrates. In some embodiments, either or both of the first and second electrode may be coated or otherwise disposed upon a substrate, such that the electrode is disposed substantially between a substrate and the active layer. The materials of composition of devices (e.g., substrate, electrode, active layer and/or active layer components) may in whole or in part be either rigid or flexible in various embodiments. In some embodiments, an electrode may act as a substrate, thereby negating the need for a separate substrate.

Furthermore, a perovskite material device according to certain embodiments may optionally include light-harvesting material (e.g., in a light-harvesting layer, such as Light Harvesting Layer 1601 as depicted in the example PV represented in FIG. 2). In addition, a perovskite material device may include any one or more additives, such as any one or more of the additives discussed above with respect to some embodiments of the present disclosure.

Figure 9:
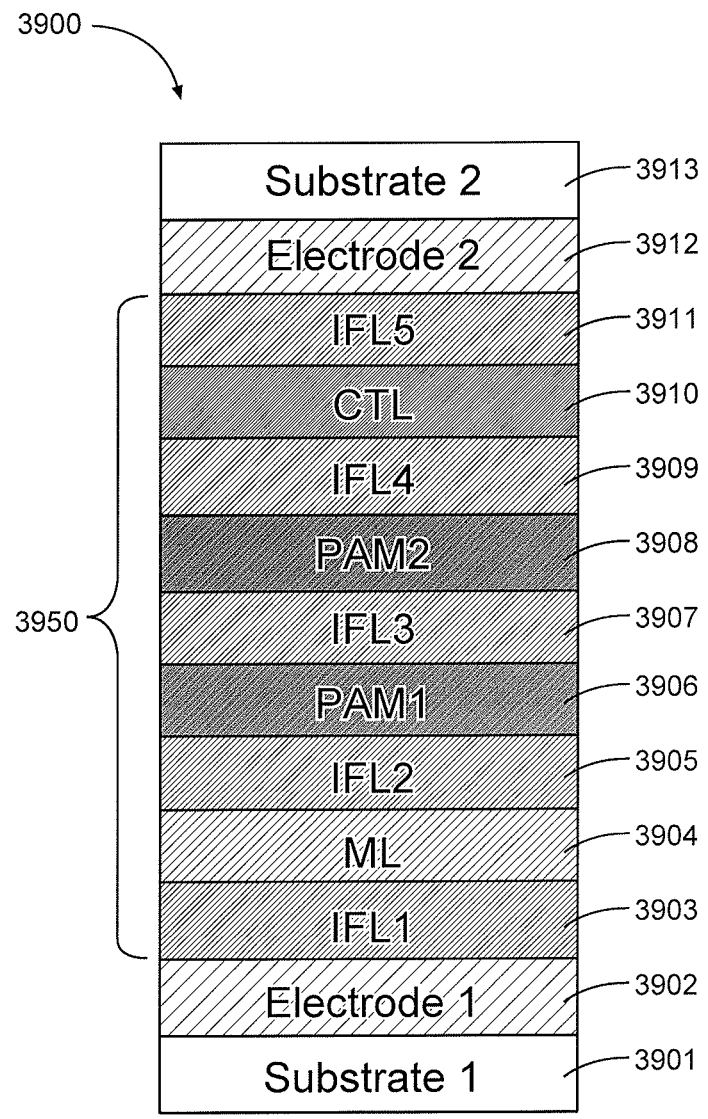
FIG. 9 is a stylized diagram showing components of an exemplar PV device according to some embodiments of the present disclosure.

Description of some of the various materials that may be included in a perovskite material device will be made in part with reference to FIG. 9. FIG. 9 is a stylized diagram of a perovskite material device 3900 according to some embodiments. Although various components of the device 3900 are illustrated as discrete layers comprising contiguous material, it should be understood that FIG. 9 is a stylized diagram; thus, embodiments in accordance with it may include such discrete layers, and/or substantially intermixed, non-contiguous layers, consistent with the usage of "layers" previously discussed herein. The device 3900 includes first and second substrates 3901 and 3913. A first electrode 3902 is disposed upon an inner surface of the first substrate 3901, and a second electrode 3912 is disposed on an inner surface of the second substrate 3913. An active layer 3950 is sandwiched between the two electrodes 3902 and 3912. The active layer 3950 includes a mesoporous layer 3904; first and second photoactive materials 3906 and 3908; a charge transport layer 3910, and several interfacial layers. FIG. 9 furthermore illustrates an example device 3900 according to embodiments wherein sub-layers of the active layer 3950 are separated by the interfacial layers, and further wherein interfacial layers are disposed upon each electrode 3902 and 3912. In particular, second, third, and fourth interfacial layers 3905, 3907, and 3909 are respectively disposed between each of the mesoporous layer 3904, first photoactive material 3906, second photoactive material 3908, and charge transport layer 3910. First and fifth interfacial layers 3903 and 3911 are respectively disposed between (i) the first electrode 3902 and mesoporous layer 3904; and (ii) the charge transport layer 3910 and second electrode 3912. Thus, the architecture of the example device depicted in FIG. 9 may be characterized as: substrate—electrode—active layer—electrode—substrate. The architecture of the active layer 3950 may be characterized as: interfacial layer—mesoporous layer—interfacial layer—photoactive material—interfacial layer—photoactive material—interfacial layer—charge transport layer—interfacial layer. As noted previously, in some embodiments, interfacial layers need not be present; or, one or more interfacial layers may be included only between certain, but not all, components of an active layer and/or components of a device.

A substrate, such as either or both of first and second substrates 3901 and 3913, may be flexible or rigid. If two substrates are included, at least one should be transparent or translucent to electromagnetic (EM) radiation (such as, e.g., UV, visible, or IR radiation). If one substrate is included, it may be similarly transparent or translucent, although it need not be, so long as a portion of the device permits EM radiation to contact the active layer 3950. Suitable substrate materials include any one or more of: glass; sapphire; magnesium oxide (MgO); mica; polymers (e.g., PEN, PET, PEG, polyolefin, polypropylene, polyethylene, polycarbonate, PMMA, polyamide; Kapton, etc.); ceramics; carbon; composites (e.g., fiberglass, Kevlar; carbon fiber); fabrics (e.g., cotton, nylon, silk, wool); wood; drywall; metal; steel; silver; gold; aluminum; magnesium; concrete; and combinations thereof.

As previously noted, an electrode (e.g., one of electrodes 3902 and 3912 of FIG. 9) may be either an anode or a cathode. In some embodiments, one electrode may function as a cathode, and the other may function as an anode. Either or both electrodes 3902 and 3912 may be coupled to leads, cables, wires, or other means enabling charge transport to and/or from the device 3900. An electrode may constitute any conductive material, and at least one electrode should be transparent or translucent to EM radiation, and/or be arranged in a manner that allows EM radiation to contact at least a portion of the active layer 3950. Suitable electrode materials may include any one or more of: indium tin oxide or tin-doped indium oxide (ITO); fluorine-doped tin oxide (FTO); cadmium oxide (CdO); zinc indium tin oxide (ZITO); aluminum zinc oxide (AZO); aluminum (Al); gold (Au); silver (Ag); calcium (Ca); chromium (Cr); magnesium (Mg); titanium (Ti); steel; carbon (and allotropes thereof); doped carbon (e.g., nitrogen-doped); nanoparticles in core-shell configurations (e.g., silicon-carbon core-shell structure); and combinations thereof.

Mesoporous material (e.g., the material included in mesoporous layer 3904 of FIG. 9) may include any pore-containing material. In some embodiments, the pores may have diameters ranging from about 1 to about 100 nm; in other embodiments, pore diameter may range from about 2 to about 50 nm. Suitable mesoporous material includes any one or more of: any interfacial material and/or mesoporous material discussed elsewhere herein; aluminum (Al); bismuth (Bi); cerium (Ce); halfnium (Hf); indium (In); molybdenum (Mo); niobium (Nb); nickel (Ni); silicon (Si); titanium (Ti); vanadium (V); zinc (Zn); zirconium (Zr); an oxide of any one or more of the foregoing metals (e.g., alumina, ceria, titania, zinc oxide, zircona, etc.); a sulfide of any one or more of the foregoing metals; a nitride of any one or more of the foregoing metals; and combinations thereof. In some embodiments, the device illustrated by FIG. 9 may not include a mesoporous material layer.

Photoactive material (e.g., first or second photoactive material 3906 or 3908 of FIG. 9) may comprise any photoactive compound, such as any one or more of silicon (in some instances, single-crystalline silicon), cadmium telluride, cadmium sulfide, cadmium selenide, copper indium gallium selenide, copper indium selenide, copper zinc tin sulfide, gallium arsenide, germanium, germanium indium phosphide, indium phosphide, one or more semiconducting polymers (e.g., polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT), polybenzodithiophenyl-thienothiophenediyl and derivatives thereof (e.g., PTB6, PTB7, PTB7-th, PCE-10); poly(triaryl amine) compounds and derivatives thereof (e.g., PTAA); polyphenylene vinylenes and derivatives thereof (e.g, MDMO-PPV, MEH-PPV), and combinations thereof. In certain embodiments, photoactive material may instead or in addition comprise a dye (e.g., N719, N3, other ruthenium-based dyes). In some embodiments, a dye (of whatever composition) may be coated onto another layer (e.g., a mesoporous layer and/or an interfacial layer). In some embodiments, photoactive material may include one or more perovskite materials. Perovskite-material-containing photoactive substance may be of a solid form, or in some embodiments it may take the form of a dye that includes a suspension or solution comprising perovskite material. Such a solution or suspension may be coated onto other device components in a manner similar to other dyes. In some embodiments, solid perovskite-containing material may be deposited by any suitable means (e.g., vapor deposition, solution deposition, direct placement of solid material, etc.). Devices according to various embodiments may include one, two, three, or more photoactive compounds (e.g., one, two, three, or more perovskite materials, dyes, or combinations thereof). In certain embodiments including multiple dyes or other photoactive materials, each of the two or more dyes or other photoactive materials may be separated by one or more interfacial layers. In some embodiments, multiple dyes and/or photoactive compounds may be at least in part intermixed.

Charge transport material (e.g., charge transport material of charge transport layer 3910 in FIG. 9) may include solid-state charge transport material (i.e., a colloquially labeled solid-state electrolyte), or it may include a liquid electrolyte and/or ionic liquid. Any of the liquid electrolyte, ionic liquid, and solid-state charge transport material may be referred to as charge transport material. As used herein, "charge transport material" refers to any material, solid, liquid, or otherwise, capable of collecting charge carriers and/or transporting charge carriers. For instance, in PV devices according to some embodiments, a charge transport material may be capable of transporting charge carriers to an electrode. Charge carriers may include holes (the transport of which could make the charge transport material just as properly labeled "hole transport material") and electrons. Holes may be transported toward an anode, and electrons toward a cathode, depending upon placement of the charge transport material in relation to either a cathode or anode in a PV or other device. Suitable examples of charge transport material according to some embodiments may include any one or more of: perovskite material; $I^-/I_3^-$; Co complexes; polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT), polybenzodithiophenyl-thienothiophenediyl and derivatives thereof (e.g., PTB6, PTB7, PTB7-th, PCE-10); poly(triaryl amine) compounds and derivatives thereof (e.g., PTAA); Spiro-OMeTAD; polyphenylene vinylenes and derivatives thereof (e.g, MDMO-PPV, MEH-PPV); fullerenes and/or fullerene derivatives (e.g., C60, PCBM); carbon nanotubes; graphite; graphene; carbon black; amorphous carbon; glassy carbon; carbon fiber; and combinations thereof. In certain embodiments, charge transport material may include any material, solid or liquid, capable of collecting charge carriers (electrons or holes), and/or capable of transporting charge carriers. Charge transport material of some embodiments therefore may be n- or p-type active and/or semi-conducting material. Charge transport material may be disposed proximate to one of the electrodes of a device. It may in some embodiments be disposed adjacent to an electrode, although in other embodiments an interfacial layer may be disposed between the charge transport material and an electrode (as shown, e.g., in FIG. 9 with the fifth interfacial layer 3911). In certain embodiments, the type of charge transport material may be selected based upon the electrode to which it is proximate. For example, if the charge transport material collects and/or transports holes, it may be proximate to an anode so as to transport holes to the anode. However, the charge transport material may instead be placed proximate to a cathode, and be selected or constructed so as to transport electrons to the cathode.

As previously noted, devices according to various embodiments may optionally include an interfacial layer between any two other layers and/or materials, although devices according to some embodiments need not contain any interfacial layers. Thus, for example, a perovskite material device may contain zero, one, two, three, four, five, or more interfacial layers (such as the example device of FIG. 9, which contains five interfacial layers 3903, 3905, 3907, 3909, and 3911). An interfacial layer may include a thin-coat interfacial layer in accordance with embodiments previously discussed herein (e.g., comprising alumina and/or other metal-oxide particles, and/or a titania/metal-oxide bilayer, and/or other compounds in accordance with thin-coat interfacial layers as discussed elsewhere herein). An interfacial layer according to some embodiments may include any suitable material for enhancing charge transport and/or collection between two layers or materials; it may also help prevent or reduce the likelihood of charge recombination once a charge has been transported away from one of the materials adjacent to the interfacial layer. Suitable interfacial materials may include any one or more of: any mesoporous material and/or interfacial material discussed elsewhere herein; Ag; Al; Au; B; Bi; Ca; Cd; Ce; Co; Cu; Fe; Ga; Ge; H; In; Mg; Mn; Mo; Nb; Ni; Pt; Sb; Sc; Si; Sn; Ta; Ti; V; W; Y; Zn; Zr; carbides of any of the foregoing metals (e.g., SiC, $Fe_3C$; WC); silicides of any of the foregoing metals (e.g., $Mg_2Si$, $SrSi_2$, $Sn_2Si$); oxides of any of the foregoing metals (e.g., alumina, silica, titania, $SnO_2$, ZnO); sulfides of any of the foregoing metals (e.g., CdS, $MoS_2$, $SnS_2$); nitrides of any of the foregoing metals (e.g., $Mg_3N_2$, TiN, BN, $Si_3N_4$); selenides of any of the foregoing metals (e.g., CdSe, $FeS_2$, ZnSe); tellurides of any of the foregoing metals (e.g., CdTe, $TiTe_2$, ZnTe); phosphides of any of the foregoing metals (e.g., InP, GaP); arsenides of any of the foregoing metals (e.g., $CoAs_3$, GaAs, InGaAs, NiAs); antimonides of any of the foregoing metals (e.g., AlSb, GaSb, InSb); halides of any of the foregoing metals (e.g., CuCl, CuI, $BiI_3$); pseudohalides of any of the foregoing metals (e.g., CuSCN, $AuCN_2$); carbonates of any of the foregoing metals (e.g., $CaCO_3$, $Ce_2(CO_3)_3$); functionalized or non-functionalized alkyl silyl groups; graphite; graphene; fullerenes; carbon nanotubes; any mesoporous material and/or interfacial material discussed elsewhere herein; and combinations thereof (including, in some embodiments, bilayers, trilayers, or multilayers of combined materials). In some embodiments, an interfacial layer may include perovskite material. Further, interfacial layers may comprise doped embodiments of any interfacial material mentioned herein (e.g., Y-doped ZnO, N-doped single-wall carbon nanotubes). Interfacial layers may also comprise a compound having three of the above materials (e.g., $CuTiO_3$, $Zn_2SnO_4$) or a compound having four of the above materials (e.g., CoNiZnO).

A device according to the stylized representation of FIG. 9 may in some embodiments be a PV, such as a DSSC, BHJ, or hybrid solar cell. In some embodiments, devices according to FIG. 9 may constitute parallel or serial multi-cell PVs, batteries, hybrid PV batteries, FETs, LEDS, and/or any other device discussed herein. For example, a BHJ of some embodiments may include two electrodes corresponding to electrodes 3902 and 3912, and an active layer comprising at least two materials in a heterojunction interface (e.g., any two of the materials and/or layers of active layer 3950). In certain embodiments, other devices (such as hybrid PV batteries, parallel or serial multi-cell PV tandem devices, etc.) may comprise an active layer including a perovskite material, corresponding to active layer 3950 of FIG. 9. In short, the stylized nature of the depiction of the example device of FIG. 9 should in no way limit the permissible structure or architecture of devices of various embodiments in accordance with FIG. 9.

Figure 9A:
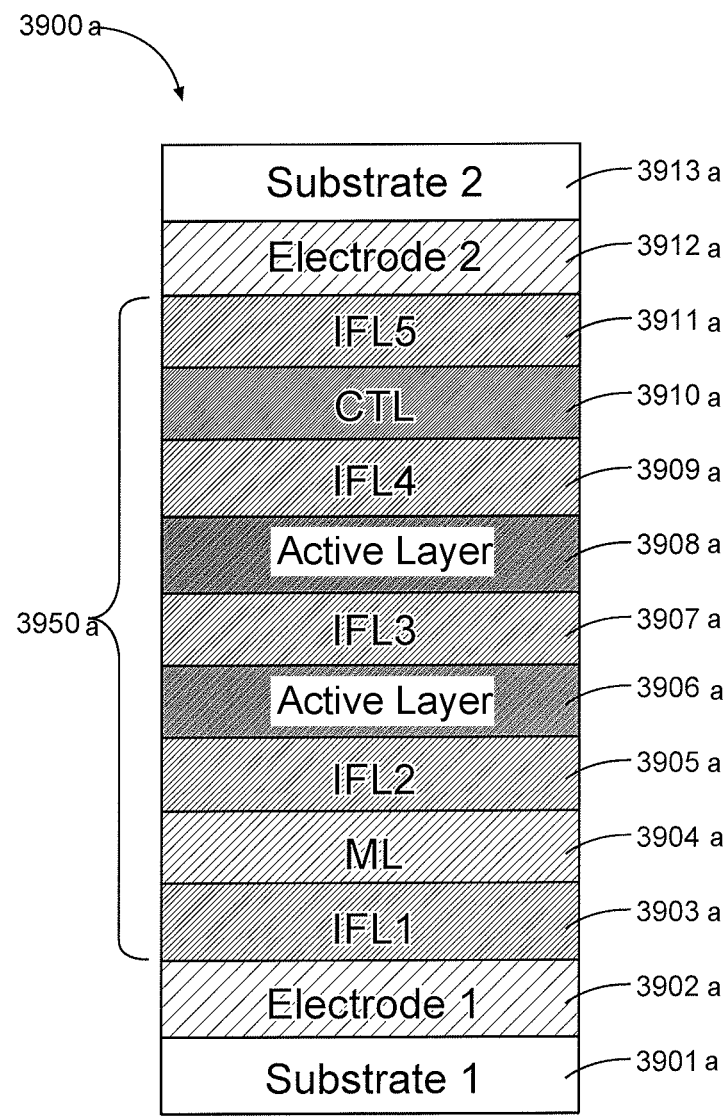
FIG. 9A is a stylized diagram showing components of an exemplar device according to some embodiments of the present disclosure.

As an example, FIG. 9A illustrates an embodiment of a perovskite material device 3900a having a similar structure to perovskite material device 3900 illustrated by FIG. 9. FIG. 9A is a stylized diagram of a perovskite material device 3900a according to some embodiments. Although various components of the device 3900a are illustrated as discrete layers comprising contiguous material, it should be understood that FIG. 9A is a stylized diagram; thus, embodiments in accordance with it may include such discrete layers, and/or substantially intermixed, non-contiguous layers, consistent with the usage of "layers" previously discussed herein. FIG. 9A includes an active layers 3906a and 3908a. One or both of active layers 3906a and 3908a may, in some embodiments, include any perovskite photoactive materials described above with respect to FIG. 9. In other embodiments, one or both of active layers 3906a and 3908a may include any photoactive material described herein, such as, thin film semiconductors (e.g., CdTe, CZTS, CIGS), photoactive polymers, dye sensitized photoactive materials, fullerenes, small molecule photoactive materials, and crystalline and polycrystalline semiconductor materials (e.g., silicon, GaAs, InP, Ge). In yet other embodiments, one or both of active layers 3906a and 3908a may include a light emitting diode (LED), field effect transistor (FET), thin film battery layer, or combinations thereof. In embodiments, one of active layers 3906a and 3908a may include a photoactive material and the other may include a light emitting diode (LED), field effect transistor (FET), thin film battery layer, or combinations thereof. For example, active layer 3908a may comprise a perovskite material photoactive layer and active layer 3906b may comprise a field effect transistor layer. Other layers illustrated of FIG. 9A, such as layers 3901a, 3902a, 3903a, 3904a, 3905a, 3907a, 3909a, 3910a, 3911a, 3912a, and 3913a, may be analogous to such corresponding layers as described herein with respect to FIG. 9.

Additional, more specific, example embodiments of perovskite devices will be discussed in terms of further stylized depictions of example devices. The stylized nature of these depictions, FIGS. 10-21, similarly is not intended to restrict the type of device which may in some embodiments be constructed in accordance with any one or more of FIGS. 10-21. That is, the architectures exhibited in FIGS. 10-21 may be adapted so as to provide the BHJs, batteries, FETs, hybrid PV batteries, serial multi-cell PVs, parallel multi-cell PVs and other similar devices of other embodiments of the present disclosure, in accordance with any suitable means (including both those expressly discussed elsewhere herein, and other suitable means, which will be apparent to those skilled in the art with the benefit of this disclosure).

Figure 10:
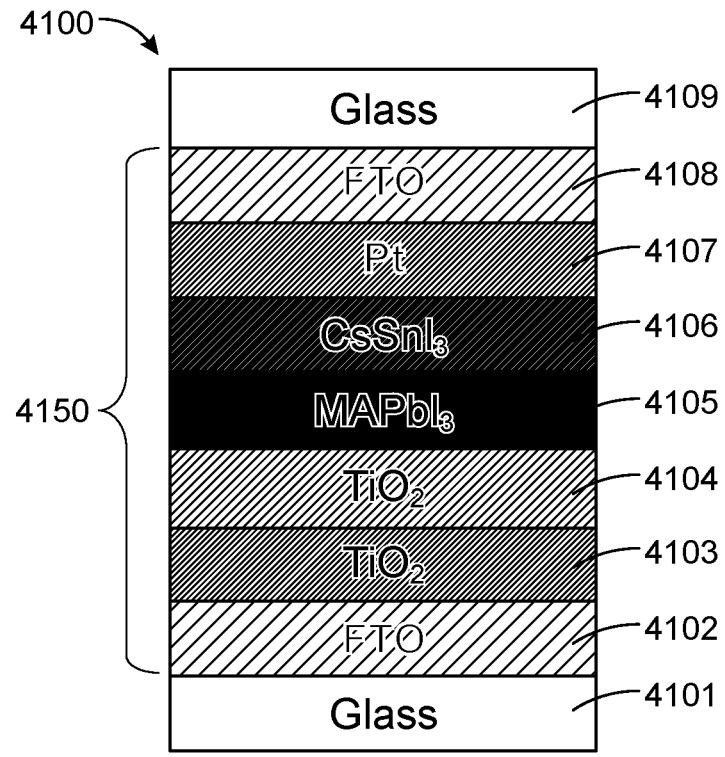
FIG. 10 is a stylized diagram showing components of an exemplar PV device according to some embodiments of the present disclosure.

FIG. 10 depicts an example device 4100 in accordance with various embodiments. The device 4100 illustrates embodiments including first and second glass substrates 4101 and 4109. Each glass substrate has an FTO electrode disposed upon its inner surface (first electrode 4102 and second electrode 4108, respectively), and each electrode has an interfacial layer deposited upon its inner surface: $TiO_2$ first interfacial layer 4103 is deposited upon first electrode 4102, and Pt second interfacial layer 4107 is deposited upon second electrode 4108. Sandwiched between the two interfacial layers are: a mesoporous layer 4104 (comprising $TiO_2$); photoactive material 4105 (comprising the perovskite material $MAPbI_3$); and a charge transport layer 4106 (here comprising $CsSnI_3$).

Figure 11:
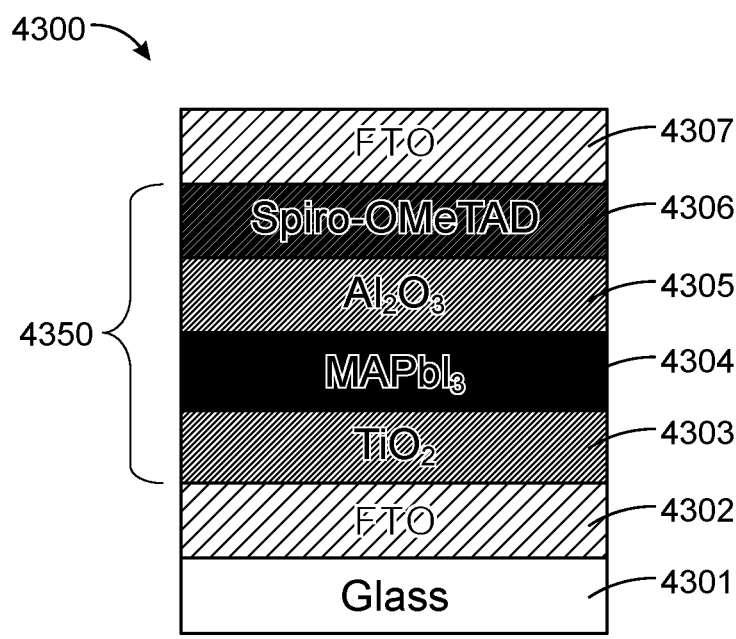
FIG. 11 is a stylized diagram showing components of an exemplar PV device according to some embodiments of the present disclosure.

FIG. 11 depicts an example device 4300 that omits a mesoporous layer. The device 4300 includes a perovskite material photoactive compound 4304 (comprising $MAPbI_3$) sandwiched between first and second interfacial layers 4303 and 4305 (comprising titania and alumina, respectively). The titania interfacial layer 4303 is coated upon an FTO first electrode 4302, which in turn is disposed on an inner surface of a glass substrate 4301. The spiro-OMeTAD charge transport layer 4306 is coated upon an alumina interfacial layer 4305 and disposed on an inner surface of a gold second electrode 4307.

As will be apparent to one of ordinary skill in the art with the benefit of this disclosure, various other embodiments are possible, such as a device with multiple photoactive layers (as exemplified by photoactive layers 3906 and 3908 of the example device of FIG. 9). In some embodiments, as discussed above, each photoactive layer may be separated by an interfacial layer (as shown by third interfacial layer 3907 in FIG. 9). Furthermore, a mesoporous layer may be disposed upon an electrode such as is illustrated in FIG. 9 by mesoporous layer 3904 being disposed upon first electrode 3902. Although FIG. 9 depicts an intervening interfacial layer 3903 disposed between the two, in some embodiments a mesoporous layer may be disposed directly on an electrode.

FIGS. 12-21 are stylized diagrams of perovskite material devices according to some embodiments. Although various components of the devices are illustrated as discrete layers comprising contiguous material, it should be understood that FIGS. 12-21 are stylized diagrams; thus, embodiments in accordance with them may include such discrete layers, and/or substantially intermixed, non-contiguous layers, consistent with the usage of "layers" previously discussed herein. The example devices include layers and materials described throughout this disclosure. The devices may include a substrate layer (e.g., glass), electrode layers (e.g., ITO, Ag), interfacial layers, which may be composite IFLs (e.g., ZnO, $Al_2O_3$, Y:ZnO, and/or Nb:ZnO), a photoactive material (e.g. $MAPbI_3$, $FAPbI_3$, 5-AVA.HCl: $MAPbI_3$, and/or CHP: $MAPbI_3$), and a charge transport layer (e.g., Spiro-OMeTAD, PCDTBT, TFB, TPD, PTB7, F8BT, PPV, MDMO-PPV, MEH-PPV, and/or P3HT).

Figure 12:
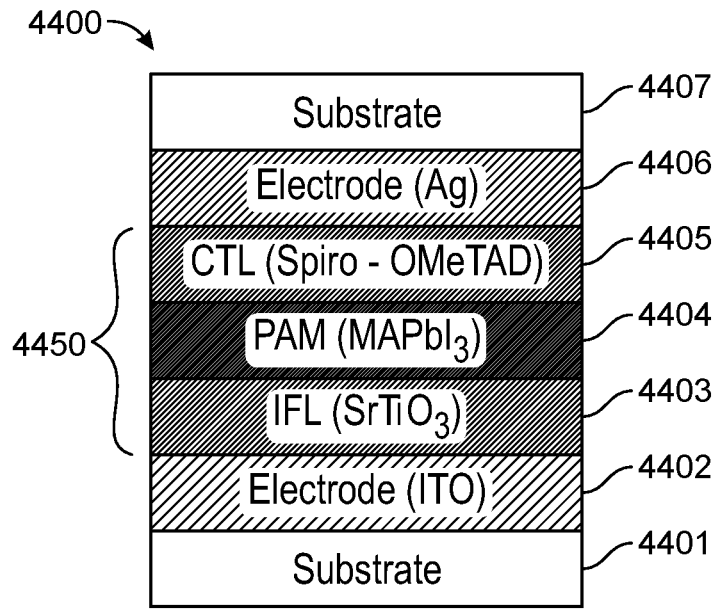
FIG. 12 is a stylized diagram showing components of an exemplar PV device according to some embodiments of the present disclosure.

FIG. 12 is a stylized diagram of a perovskite material device 4400 according to some embodiments. Although various components of the device 4400 are illustrated as discrete layers comprising contiguous material, it should be understood that FIG. 12 is a stylized diagram; thus, embodiments in accordance with it may include such discrete layers, and/or substantially intermixed, non-contiguous layers, consistent with the usage of "layers" previously discussed herein. The device 4400 includes first and second substrates 4401 and 4407. A first electrode (ITO) 4402 is disposed upon an inner surface of the first substrate 4401, and a second electrode (Ag) 4406 is disposed on an inner surface of the second substrate 4407. An active layer 4450 is sandwiched between the two electrodes 4402 and 4406. The active layer 4450 includes a first IFL (e.g., $SrTiO_3$) 4403, a photoactive material (e.g., $MAPbI_3$) 4404, and a charge transport layer (e.g., Spiro-OMeTAD) 4405.

Figure 13:
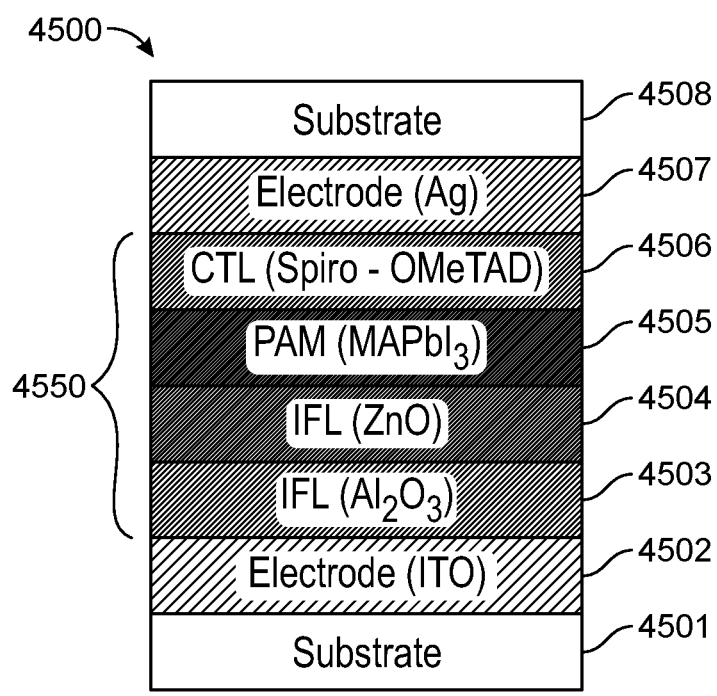
FIG. 13 is a stylized diagram showing components of an exemplar PV device according to some embodiments of the present disclosure.

FIG. 13 is a stylized diagram of a perovskite material device 4500 according to some embodiments. Although various components of the device 4500 are illustrated as discrete layers comprising contiguous material, it should be understood that FIG. 13 is a stylized diagram; thus, embodiments in accordance with it may include such discrete layers, and/or substantially intermixed, non-contiguous layers, consistent with the usage of "layers" previously discussed herein. The device 4500 includes first and second substrates 4501 and 4508. A first electrode (e.g., ITO) 4502 is disposed upon an inner surface of the first substrate 4501, and a second electrode (e.g., Ag) 4507 is disposed on an inner surface of the second substrate 4508. An active layer 4550 is sandwiched between the two electrodes 4502 and 4507. The active layer 4550 includes a composite IFL comprising a first IFL (e.g., $Al_2O_3$) 4503 and a second IFL (e.g., ZnO) 4504, a photoactive material (e.g., $MAPbI_3$) 4505, and a charge transport layer (e.g., Spiro-OMeTAD) 4506.

Figure 14:
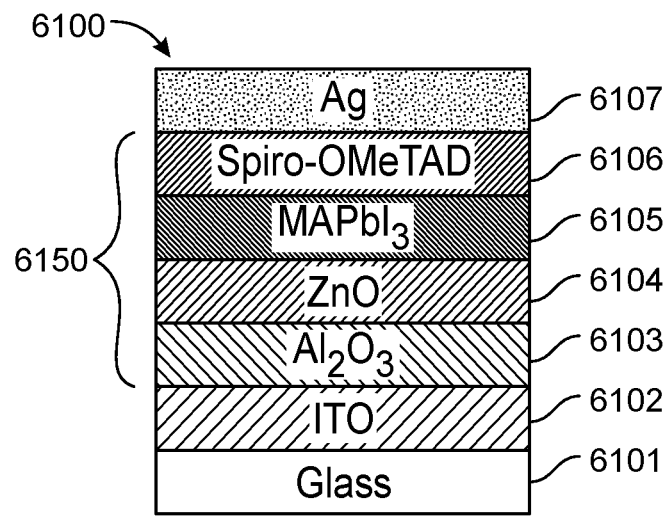
FIG. 14 is a stylized diagram showing components of an exemplar PV device according to some embodiments of the present disclosure.

FIG. 14 is a stylized diagram of a perovskite material device 6100 according to some embodiments. Although various components of the device 6100 are illustrated as discrete layers comprising contiguous material, it should be understood that FIG. 14 is a stylized diagram; thus, embodiments in accordance with it may include such discrete layers, and/or substantially intermixed, non-contiguous layers, consistent with the usage of "layers" previously discussed herein. The device 6100 includes a substrate (e.g., Glass) 6101. A first electrode (e.g., ITO) 6102 is disposed upon an inner surface of the substrate 6101, and a second electrode (e.g., Ag) 6107 is disposed on top of an active layer 6150 that is sandwiched between the two electrodes 6102 and 6107. The active layer 6150 includes a composite IFL comprising a first IFL (e.g., $Al_2O_3$) 6103 and a second IFL (e.g., ZnO) 6104, a photoactive material (e.g., $MAPbI_3$) 6105, and a charge transport layer (e.g., Spiro-OMeTAD) 6106.

Figure 15:
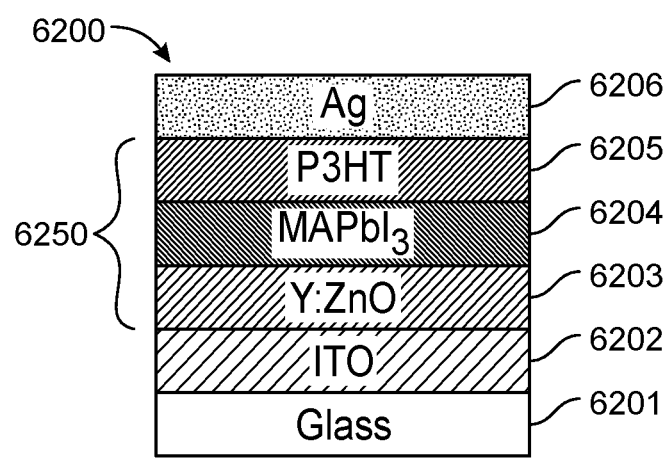
FIG. 15 is a stylized diagram showing components of an exemplar PV device according to some embodiments of the present disclosure.

FIG. 15 is a stylized diagram of a perovskite material device 6200 according to some embodiments. Although various components of the device 6200 are illustrated as discrete layers comprising contiguous material, it should be understood that FIG. 15 is a stylized diagram; thus, embodiments in accordance with it may include such discrete layers, and/or substantially intermixed, non-contiguous layers, consistent with the usage of "layers" previously discussed herein. The device 6200 includes a substrate (e.g., Glass) 6201. A first electrode (e.g., ITO) 6202 is disposed upon an inner surface of the substrate 6201, and a second electrode (e.g., Ag) 6206 is disposed on top of an active layer 6250 that is sandwiched between the two electrodes 6202 and 6206. The active layer 6250 includes an IFL (e.g., Y:ZnO) 6203, a photoactive material (e.g., $MAPbI_3$) 6204, and a charge transport layer (e.g., P3HT) 6205.

Figure 16:
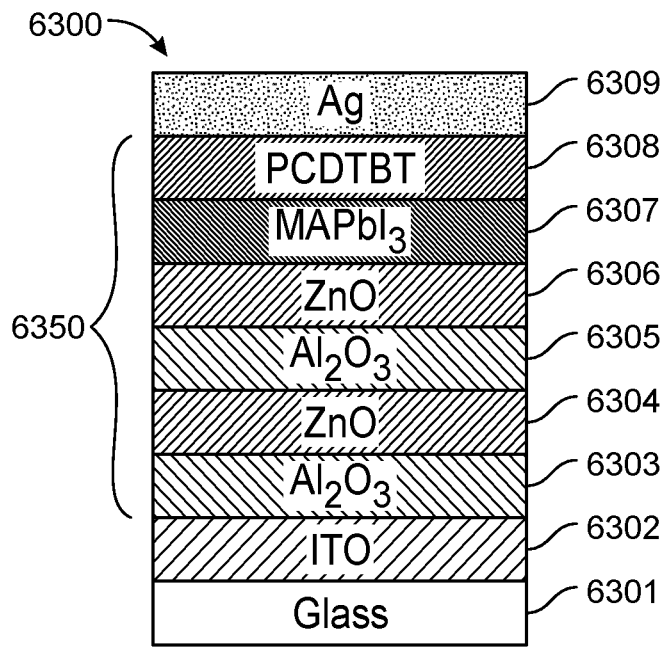
FIG. 16 is a stylized diagram showing components of an exemplar PV device according to some embodiments of the present disclosure.

FIG. 16 is a stylized diagram of a perovskite material device 6300 according to some embodiments. Although various components of the device 6300 are illustrated as discrete layers comprising contiguous material, it should be understood that FIG. 16 is a stylized diagram; thus, embodiments in accordance with it may include such discrete layers, and/or substantially intermixed, non-contiguous layers, consistent with the usage of "layers" previously discussed herein. The device 6300 includes a substrate (e.g., Glass) 6301. A first electrode (e.g., ITO) 6302 is disposed upon an inner surface of the substrate 6301, and a second electrode (e.g., Ag) 6309 is disposed on top of an active layer 6350 that is sandwiched between the two electrodes 6302 and 6309. The active layer 6350 includes a composite IFL comprising a first IFL (e.g., $Al_2O_3$) 6303, a second IFL (e.g., ZnO) 6304, a third IFL (e.g., $Al_2O_3$) 6305, and a fourth IFL (e.g., ZnO) 6306, a photoactive material (e.g., $MAPbI_3$) 6307, and a charge transport layer (e.g., PCDTBT) 6308.

Figure 17:
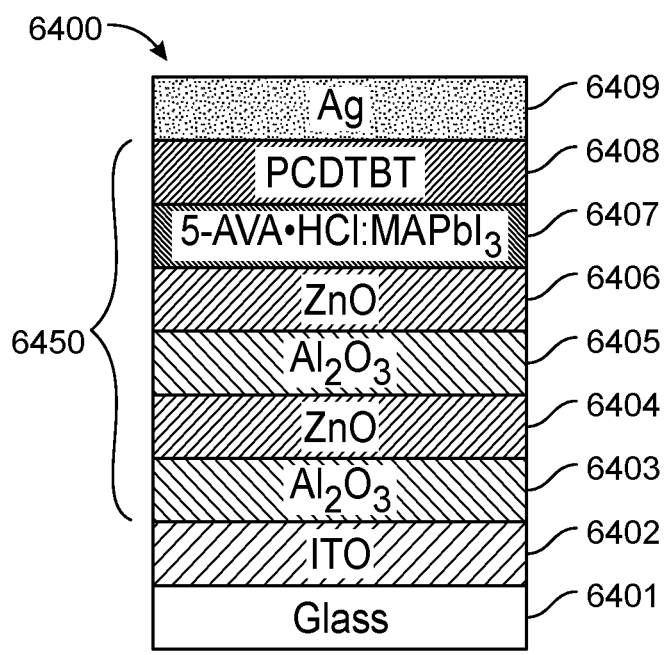
FIG. 17 is a stylized diagram showing components of an exemplar PV device according to some embodiments of the present disclosure.

FIG. 17 is a stylized diagram of a perovskite material device 6400 according to some embodiments. Although various components of the device 6400 are illustrated as discrete layers comprising contiguous material, it should be understood that FIG. 17 is a stylized diagram; thus, embodiments in accordance with it may include such discrete layers, and/or substantially intermixed, non-contiguous layers, consistent with the usage of "layers" previously discussed herein. The device 6400 includes a substrate (e.g., Glass) 6401. A first electrode (e.g., ITO) 6402 is disposed upon an inner surface of the substrate 6401, and a second electrode (e.g., Ag) 6409 is disposed on top of an active layer 6450 that is sandwiched between the two electrodes 6402 and 6409. The active layer 6450 includes a composite IFL comprising a first IFL (e.g., $Al_2O_3$) 6403, a second IFL (e.g., ZnO) 6404, a third IFL (e.g., $Al_2O_3$) 6405, and a fourth IFL (e.g., ZnO) 6406, a photoactive material (e.g., 5-AVA.HCl: $MAPbI_3$) 6407, and a charge transport layer (e.g., PCDTBT) 6408.

Figure 18:
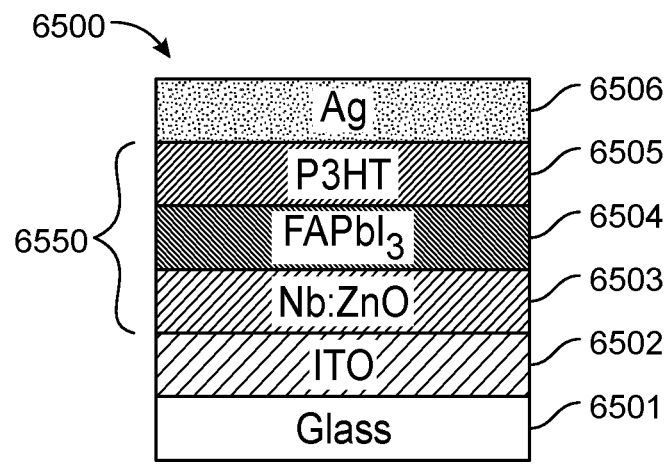
FIG. 18 is a stylized diagram showing components of an exemplar PV device according to some embodiments of the present disclosure.

FIG. 18 is a stylized diagram of a perovskite material device 6500 according to some embodiments. Although various components of the device 6500 are illustrated as discrete layers comprising contiguous material, it should be understood that FIG. 18 is a stylized diagram; thus, embodiments in accordance with it may include such discrete layers, and/or substantially intermixed, non-contiguous layers, consistent with the usage of "layers" previously discussed herein. The device 6500 includes a substrate (e.g., Glass) 6501. A first electrode (e.g., ITO) 6502 is disposed upon an inner surface of the substrate 6501, and a second electrode (e.g., Ag) 6506 is disposed on top of an active layer 6550 that is sandwiched between the two electrodes 6502 and 6506. The active layer 6550 includes an IFL (e.g., Nb:ZnO) 6503, a photoactive material (e.g., $FAPbI_3$) 6504, and a charge transport layer (e.g., P3HT) 6505.

Figure 19:
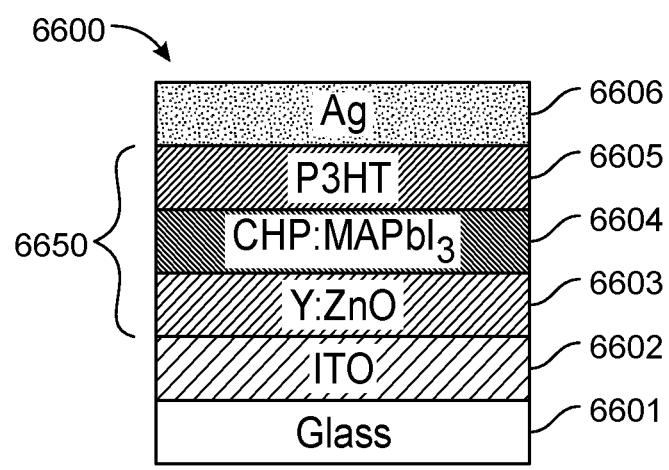
FIG. 19 is a stylized diagram showing components of an exemplar PV device according to some embodiments of the present disclosure.

FIG. 19 is a stylized diagram of a perovskite material device 6600 according to some embodiments. Although various components of the device 6600 are illustrated as discrete layers comprising contiguous material, it should be understood that FIG. 19 is a stylized diagram; thus, embodiments in accordance with it may include such discrete layers, and/or substantially intermixed, non-contiguous layers, consistent with the usage of "layers" previously discussed herein. The device 6600 includes a substrate (e.g., Glass) 6601. A first electrode (e.g., ITO) 6602 is disposed upon an inner surface of the substrate 6601, and a second electrode (e.g., Ag) 6606 is disposed on top of an active layer 6650 that is sandwiched between the two electrodes 6602 and 6606. The active layer 6650 includes an IFL (e.g., Y:ZnO) 6603, a photoactive material (e.g., CHP; $MAPbI_3$) 6604, and a charge transport layer (e.g., P3HT) 6605.

Figure 20:
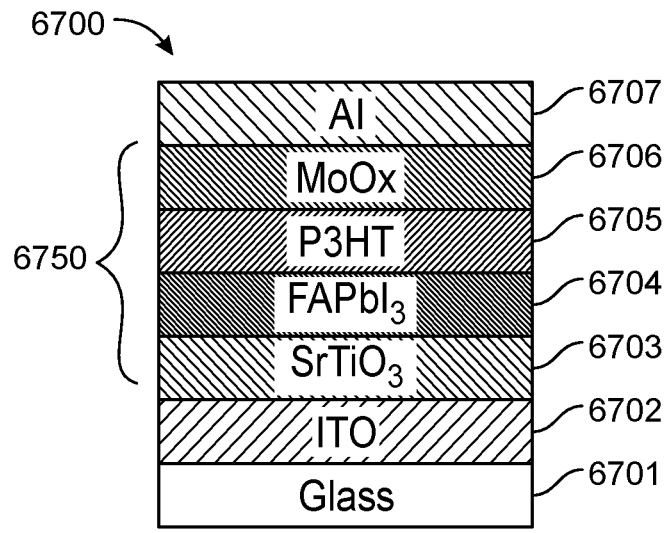
FIG. 20 is a stylized diagram showing components of an exemplar PV device according to some embodiments of the present disclosure.

FIG. 20 is a stylized diagram of a perovskite material device 6700 according to some embodiments. Although various components of the device 6700 are illustrated as discrete layers comprising contiguous material, it should be understood that FIG. 20 is a stylized diagram; thus, embodiments in accordance with it may include such discrete layers, and/or substantially intermixed, non-contiguous layers, consistent with the usage of "layers" previously discussed herein. The device 6700 includes a substrate (e.g., Glass) 6701. A first electrode (e.g., ITO) 6702 is disposed upon an inner surface of the substrate 6701, and a second electrode (e.g., Al) 6707 is disposed on top of an active layer 6750 that is sandwiched between the two electrodes 6702 and 6707. The active layer 6750 includes an IFL (e.g., $SrTiO_3$) 6703 a photoactive material (e.g., $FAPbI_3$) 6704, a first charge transport layer (e.g., P3HT) 6705, and a second charge transport layer (e.g., MoOx) 6706.

Figure 21:
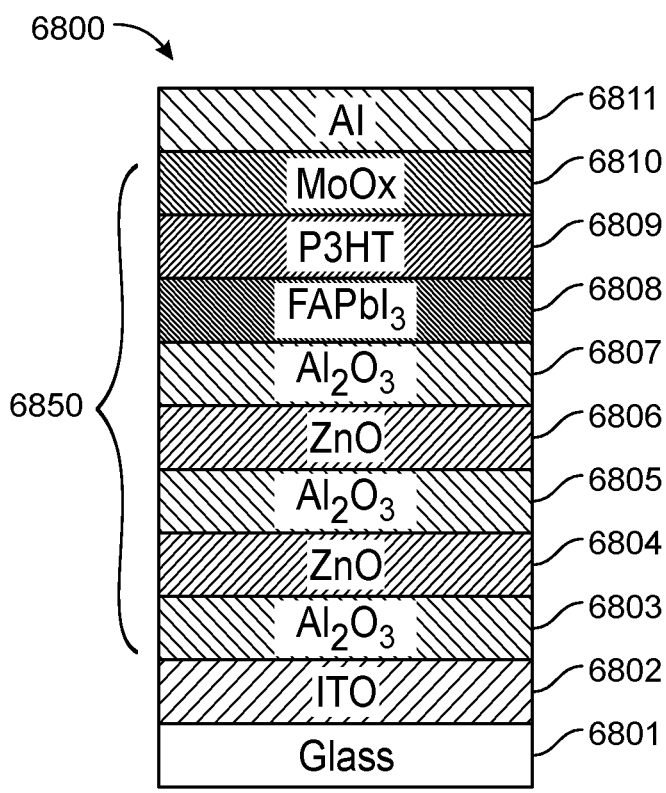
FIG. 21 is a stylized diagram showing components of an exemplar PV device according to some embodiments of the present disclosure.

FIG. 21 is a stylized diagram of a perovskite material device 6800 according to some embodiments. Although various components of the device 6800 are illustrated as discrete layers comprising contiguous material, it should be understood that FIG. 21 is a stylized diagram; thus, embodiments in accordance with it may include such discrete layers, and/or substantially intermixed, non-contiguous layers, consistent with the usage of "layers" previously discussed herein. The device 6800 includes a substrate (e.g., Glass) 6801. A first electrode (e.g., ITO) 6802 is disposed upon an inner surface of the substrate 6801, and a second electrode (e.g., Al) 6811 is disposed on top of an active layer 6850 that is sandwiched between the two electrodes 6802 and 6811. The active layer 6850 includes a composite IFL comprising a first IFL (e.g., $Al_2O_3$) 6803, a second IFL (e.g., ZnO) 6804, a third IFL (e.g., $Al_2O_3$) 6805, a fourth IFL (e.g., ZnO) 6806, and a fifth IFL (e.g., $Al_2O_3$) 6807, a photoactive material (e.g., $FAPbI_3$) 6808, a first charge transport layer (e.g., P3HT) 6809, and a second charge transport layer (e.g., MoOx) 6810.

Encapsulant Layer for Thin Film Photovoltaic Device

Figure 22:
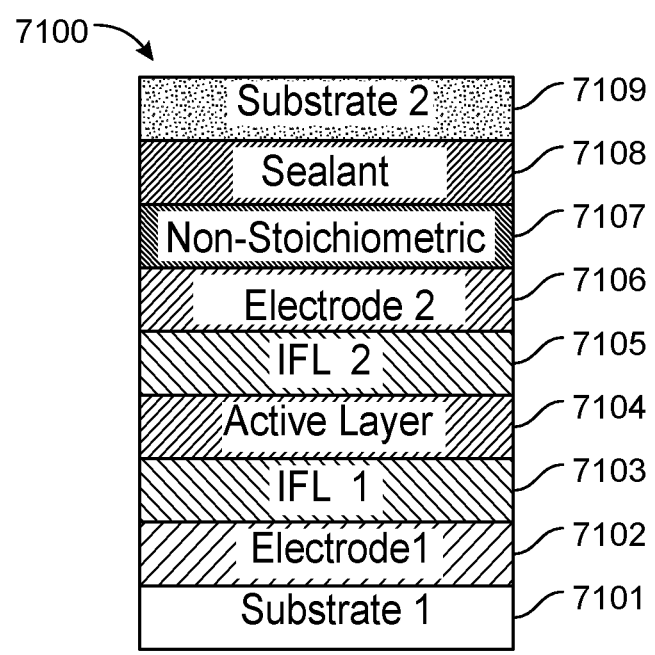
FIG. 22 is a stylized diagram showing components of an exemplar PV device according to some embodiments of the present disclosure.

In some embodiments, a PV device may include one or more encapsulating layers. The encapsulating layers may be located proximate to an electrode layer of the PV device. FIG. 22 illustrates an embodiment of a photovoltaic device 7100 including encapsulating layers. Although various components of the device 7100 are illustrated as discrete layers comprising contiguous material, it should be understood that FIG. 22 is a stylized diagram; thus, embodiments in accordance with it may include such discrete layers, and/or substantially intermixed, non-contiguous layers, consistent with the usage of "layers" previously discussed herein. The photovoltaic device illustrated by Figure Z includes several layers including: a first substrate 7101, a first electrode 7102, a first interfacial layer 7103, an active layer 7104, a second interfacial layer 7105, a second electrode 7106, a non-stoichiometric compound layer Z107, a sealing layer 7108 (also referred to as an encapsulant layer), and a second substrate 7109.

The first substrate 7101 and the second substrate 7109 may be flexible or rigid. Substrates 7101 and 7109 may be any suitable substrate material described throughout the instant application, and in particular embodiments may be any suitable substrate material described with respect to FIGS. 1-21. In some embodiments, only one substrate layer may be included in a PV device. If two substrates are included, at least one should be transparent or translucent to electromagnetic (EM) radiation (such as, e.g., UV, visible, or IR radiation). If one substrate is included, it may be similarly transparent or translucent, although it need not be, so long as a portion of the device permits EM radiation to contact the active layer 7104. Suitable substrate materials include any one or more of: glass; sapphire; magnesium oxide (MgO); mica; polymers (e.g., PEN, PET, PEG, polyolefin, polypropylene, polyethylene, polycarbonate, PMMA, polyamide; Kapton, etc.); ceramics; carbon; composites (e.g., fiberglass, Kevlar; carbon fiber) fabrics (e.g., nylon, cotton, silk, wool); wood; drywall; metal; steel; silver; gold; aluminum; magnesium; concrete; or any other substrate discussed herein with respect to FIGS. 6-21 and combinations thereof. In the illustrated embodiment the first substrate 7101 may be impermeable to gases or liquids, or sufficiently thick so as to be effectively impermeable to gases or liquids, thereby preventing corrosive or oxidizing materials from reaching layers 7102 through 7108.

Electrode 7102 and electrode 7106 may be any suitable electrode material described throughout the instant application, and in particular embodiments may be any suitable electrode material described with respect to FIGS. 1-21. For example, materials suitable for electrodes 7102 and 7106 include ITO, FTO, CdO, ZITO, AZO, Al, Au, Cu, Pt, Ca, Mg, Ti, steel, carbon, carbon allotropes (e.g. carbon black, fullerenes, graphene, single wall carbon nanotubes, double wall carbon nanotubes), or any other conductive material. Likewise interfacial layers 7103 and 7105 may be any suitable interfacial layer material described throughout the instant application, and in particular embodiments may be any suitable interfacial layer material described with respect to FIGS. 1-20. Examples of such materials include oxides, sulfides, or nitrides of Al, Bi, In, Mo, Ni, Si, Ti, V, Nb, Sn, Zn, and combinations thereof (e.g. NiO, $Zn_2SnO_4$); functionalized or non-functionalized alkyl silyl; groups; and carbon, and carbon allotropes (e.g. carbon black, fullerenes, graphene, single wall carbon nanotubes, double wall carbon nanotubes). In some embodiments, device 7100 may have only one interfacial layer, such as only one of interfacial layers 7103 or 7105. In other embodiments, device 7100 may have no interfacial layers.

As with electrode layers 7102 and 7106 and interfacial layers 7103 and 7105, active layer 7104 may be any active layer material or photoactive material described throughout the instant application, and in particular embodiments may be any suitable material described with respect to FIGS. 1-21. In some embodiments active layer 7104 may be a photoactive layer. In other embodiments active layers 7104 may be a light emitting diode (LED), field effect transistor (FET), thin film battery layer, or combinations thereof. Examples of active layers 7104 materials include perovskite materials, thin film semiconductors (e.g., CdTe, CZTS, CIGS), photoactive polymers, dye sensitized photoactive materials, fullerenes, small molecule photoactive materials (e.g., bathocuproine, perylene monoamide, perylene diimide, spiro-OMeTAD, triaryl amine, anthracene, tertracene, pentacene, rubrene, anthradithiophene, quaterthiophene, benzothiophene, TCNQ, ZnPc, CuPc, subPc, TPD, Alq3, Znq2, Zn(BOX)2, BTBT-C5, chlorophyll-a, TIPS-Si), and crystalline and polycrystalline semiconductor materials (e.g., silicon, GaAs, InP, Ge).

The sealing layer 7108 and the non-stoichiometric compound layer 7107 provide protection for layers 7102 through 7106 from the environment in which photovoltaic device 7100 resides. Sealing layer 7108 may include an epoxy (e.g., one part epoxies, two part epoxies, epoxy resin, novolac epoxy resin, aliphatic epoxy resin, bisphenol A epoxy resin, bisphenol F epoxy resin, glycidylamine epoxy resin, amine-based curing epoxy resins, anhydride based curing epoxy resins, thiol-based curing epoxy resins, and phenol-based curing epoxy resins), polymers such as silicone, polypropylene, polybutylene, polyisobutylene, polycarbonate, PMMA, and EVA, glass frit, or combinations thereof. In some embodiments, sealing layer 7108 may be impermeable to gases such as air, oxygen, water vapor, carbon dioxide, nitrogen, ammonia, and halogens. In other embodiments sealing layer 7108 may have a low permeability to gases such as air, oxygen, water vapor, carbon dioxide, nitrogen, ammonia, and halogens. For example, in certain embodiments sealing layer 7108 may have a permeability equal to or less than 200 $g/m^2$ per day at 85 degrees Celsius. In some embodiments, sealing layer 7108 may have a thickness between zero and 100 microns. In other embodiments, sealing layer 7108 may have a thickness between 10 microns and 10 millimeters.

Non-stoichiometric compound layer 7107 may be include oxygen containing compounds in which oxygen is either deficient or in excess with respect to chemical stoichiometry. In certain embodiments, oxide compounds comprising non-stoichiometric compound layer 7107 may have a formula of $M_xO_y$, where M is a metal, O is oxygen, and x and y are real numbers between 1 and 10. In some embodiments, non-stoichiometric compound layer 7107 may include SiO, $CrO_2$, MnO, VO, FeO, CeO, LaO, HfO, ZrO, TiO, AlO, GeO, or combinations thereof. In other embodiments, non-stoichiometric oxide layer 7107 may include a binary, trinary, ternary or greater compound, such as $Na_wFe_xTi_yO_z$, where w, x, y, and z represent real numbers. For example, a binary non-stoichiometric compound may have a formula that can be generally represented as $M1_xM2_yO_z$, where M1 is a first metal, M2 is a second metal, and x, y and z represent real numbers. As further examples, a trinary non-stoichiometric compound may have a formula that can be generally represented as $M1_wM2_xM3_yO_z$, a ternary compound may have a formula that can be generally represented as $M1_vM2_wM3_xM4_yO_z$ and so on. In general a non-stoichiometric oxide refers to any metal oxide that is not the most stable metal oxide that can be formed for a particular metal or mixture of metals. Table 1 shows metal oxides corresponding to different oxidation states for several metals. "Stoichiometric" metal oxides are identified with an asterisk in Table 1, and all other metal oxides can be considered non-stoichiometric.

TABLE 1

Non-Stoichiometric and Stoichiometric Oxides

| Metal | +1 | +2 | +3 | +4 | +5 | +6 | +7 |
|---|---|---|---|---|---|---|---|
| Al | $Al_2O$ | AlO | $*Al_2O_3$ | N/A | N/A | N/A | N/A |
| Bi | $Bi_2O$ | BiO | $Bi_2O_3$ | $BiO_2$ | $*Bi_2O_5$ | N/A | N/A |
| Ce | $Ce_2O$ | CeO | $Ce_2O_3$ | $*CeO_2$ | N/A | N/A | N/A |
| Co | $Co_2O$ | CoO | $*Co_2O_3$ | N/A | N/A | N/A | N/A |
| Cr | $Cr_2O$ | CrO | $Cr_2O_3$ | $CrO_2$ | $Cr_2O_5$ | $*CrO_3$ | N/A |
| Cu | $Cu_2O$ | $*CuO$ | $Cu_2O_3$ | N/A | N/A | N/A | N/A |
| Fe | $Fe_2O$ | FeO | $*Fe_2O_3$ | $FeO_2$ | N/A | N/A | N/A |
| Ge | $Ge_2O$ | GeO | $Ge_2O_3$ | $*GeO_2$ | N/A | N/A | N/A |
| Hf | $Hf_2O$ | HfO | $Hf_2O_3$ | $*HfO_2$ | N/A | N/A | N/A |
| In | $In_2O$ | InO | $*In_2O_3$ | N/A | N/A | N/A | N/A |
| La | $La_2O$ | LaO | $*La_2O_3$ | N/A | N/A | N/A | N/A |
| Mn | $Mn_2O$ | MnO | $Mn_2O_3$ | $MnO_2$ | $Mn_2O_5$ | $MnO_3$ | $*MnO_4^-$ |
| Mo | $Mo_2O$ | MoO | $Mo_2O_3$ | $MoO_2$ | $Mo_2O_5$ | $*MoO_3$ | N/A |
| Nb | $Nb_2O$ | NbO | $Nb_2O_3$ | $NbO_2$ | $*Nb_2O_5$ | N/A | N/A |
| Sb | $Sb_2O$ | SbO | $Sb_2O_3$ | $SbO_2$ | $*Sb_2O_5$ | N/A | N/A |
| Sc | $Sc_2O$ | ScO | $*Sc_2O_3$ | N/A | N/A | N/A | N/A |
| Si | $Si_2O$ | SiO | $Si_2O_3$ | $*SiO_2$ | N/A | N/A | N/A |
| Sn | $Sn_2O$ | SnO | $Sn_2O_3$ | $*SnO_2$ | N/A | N/A | N/A |
| Ta | $Ta_2O$ | TaO | $Ta_2O_3$ | $TaO_2$ | $*Ta_2O_5$ | N/A | N/A |
| Ti | $Ti_2O$ | TiO | $Ti_2O_3$ | $*TiO_2$ | N/A | N/A | N/A |
| V | $V_2O$ | VO | $V_2O_3$ | $VO_2$ | $*V_2O_5$ | N/A | N/A |
| Y | $Y_2O$ | YO | $*Y_2O_3$ | N/A | N/A | N/A | N/A |
| Zr | $Zr_2O$ | ZrO | $Zr_2O_3$ | $*ZrO_2$ | N/A | N/A | N/A |

Additionally, non-stoichiometric compound layer 7107 may be include sulfur containing compounds in which sulfur is either deficient or in excess with respect to chemical stoichiometry. In certain embodiments, sulfide compounds comprising non-stoichiometric compound layer 7107 may have a formula of $M_xS_y$, where M is a metal, S is sulfur, and x and y are real numbers between 1 and 10. In some embodiments, non-stoichiometric compound layer 7107 may include SiS, $CrS_2$, MnS, VS, FeS, CeS, LaS, HfS, ZrS, TiS, AlS, GeS, or combinations thereof. In other embodiments, non-stoichiometric compound layer 7107 may include a binary, trinary, ternary or greater compound, such as $Na_wFe_xTi_yS_z$, where w, x, y, and z represent real numbers. For example, a binary non-stoichiometric sulfide compound may have a formula that can be generally represented as $M1_xM2_yS_z$, where M1 is a first metal, M2 is a second metal, and x, y and z represent real numbers. As further examples, a trinary non-stoichiometric sulfide compound may have a formula that can be generally represented as $M1_wM2_xM3_yS_z$, a ternary compound may have a formula that can be generally represented as $M1_vM2_wM3_xM4_yS_z$ and so on. In general a non-stoichiometric sulfide refers to any metal sulfide that is not the most stable metal sulfide that can be formed for a particular metal or mixture of metals. Table 2 shows metal sulfides corresponding to different oxidation states for several metals. "Stoichiometric" metal sulfides are identified with an asterisk in Table 2, and all other metal oxides can be considered non-stoichiometric.

TABLE 2

Non-Stoichiometric and Stoichiometric Sulfides

| Metal | +1 | +2 | +3 | +4 | +5 | +6 | +7 |
|---|---|---|---|---|---|---|---|
| Al | $Al_2S$ | AlS | $*Al_2S_3$ | N/A | N/A | N/A | N/A |
| Bi | $Bi_2S$ | BiS | $Bi_2S_3$ | $BiS_2$ | $*Bi_2S_5$ | N/A | N/A |
| Ce | $Ce_2S$ | CeS | $*Ce_2S_3$ | $CeS_2$ | N/A | N/A | N/A |
| Co | $Co_2S$ | CoS | $*Co_2S_3$ | N/A | N/A | N/A | N/A |
| Cr | $Cr_2S$ | CrS | $*Cr_2S_3$ | $CrS_2$ | $Cr_2S_5$ | $CrS_3$ | N/A |
| Cu | $Cu_2S$ | $*CuS$ | $Cu_2S_3$ | N/A | N/A | N/A | N/A |
| Fe | $Fe_2S$ | FeS | $*Fe_2S_3$ | $FeS_2$ | N/A | N/A | N/A |
| Ge | $Ge_2S$ | GeS | $Ge_2S_3$ | $*GeS_2$ | N/A | N/A | N/A |
| Hf | $Hf_2S$ | HfS | $Hf_2S_3$ | $*HfS_2$ | N/A | N/A | N/A |
| In | $In_2S$ | InS | $*In_2S_3$ | N/A | N/A | N/A | N/A |
| La | $La_2S$ | LaS | $*La_2S_3$ | N/A | N/A | N/A | N/A |
| Mn | $Mn_2S$ | $*MnS$ | $Mn_2S_3$ | $MnS_2$ | $Mn_2S_5$ | $MnS_3$ | $MnS_4^-$ |
| Mo | $Mo_2S$ | MoS | $Mo_2S_3$ | $MoS_2$ | $Mo_2S_5$ | $*MoS_3$ | N/A |
| Nb | $Nb_2S$ | NbS | $Nb_2S_3$ | $*NbS_2$ | $Nb_2S_5$ | N/A | N/A |
| Sb | $Sb_2S$ | SbS | $Sb_2S_3$ | $SbS_2$ | $Sb_2S_5$ | N/A | N/A |
| Sc | $Sc_2S$ | ScS | $*Sc_2S_3$ | N/A | N/A | N/A | N/A |
| Si | $Si_2S$ | SiS | $Si_2S_3$ | $*SiS_2$ | N/A | N/A | N/A |
| Sn | $Sn_2S$ | SnS | $Sn_2S_3$ | $*SnS_2$ | N/A | N/A | N/A |
| Ta | $Ta_2S$ | TaS | $Ta_2S_3$ | $*TaS_2$ | $Ta_2S_5$ | N/A | N/A |
| Ti | $Ti_2S$ | TiS | $Ti_2S_3$ | $*TiS_2$ | N/A | N/A | N/A |
| V | $V_2S$ | VS | $*V_2S_3$ | $VS_2$ | $V_2S_5$ | N/A | N/A |
| Y | $Y_2S$ | YS | $*Y_2S_3$ | N/A | N/A | N/A | N/A |
| Zr | $Zr_2S$ | ZrS | $Zr_2S_3$ | $*ZrS_2$ | N/A | N/A | N/A |

Further, non-stoichiometric compound layer 7107 may be include nitrogen containing compounds in which nitrogen is either deficient or in excess with respect to chemical stoichiometry. In certain embodiments, nitride compounds comprising non-stoichiometric compound layer 7107 may have a formula of $M_xN_y$, where M is a metal, N is nitrogen, and x and y are real numbers between 1 and 10. In some embodiments, non-stoichiometric compound layer 7107 may include SiN, $Cr_3N_2$, MnN, $V_3N_2$, $Fe_3N_2$, $Ce_3N_2$, $La_3N_2$, $Hf_3N_2$, $Zr_3N_2$, $Ti_3N_2$, $Al_3N_2$, GeN, or combinations thereof. In other embodiments, non-stoichiometric compound layer 7107 may include a binary, trinary, ternary or greater compound, such as $Na_wFe_xTi_yN_z$, where w, x, y, and z represent real numbers. For example, a binary non-stoichiometric sulfide compound may have a formula that can be generally represented as $M1_xM2_yN_z$, where M1 is a first metal, M2 is a second metal, and x, y and z represent real numbers. As further examples, a trinary non-stoichiometric sulfide compound may have a formula that can be generally represented as $M1_wM2_xM3_yN_z$, a ternary compound may have a formula that can be generally represented as $M1_vM2_wM3_xM4_yN_z$ and so on. In general a non-stoichiometric sulfide refers to any metal sulfide that is not the most stable metal sulfide that can be formed for a particular metal or mixture of metals. Table 3 shows metal nitrides corresponding to different oxidation states for several metals. "Stoichiometric" metal nitrides are identified with an asterisk in Table 3, and all other metal oxides can be considered non-stoichiometric.

TABLE 3

Non-Stoichiometric and Stoichiometric Nitrides

| Metal | Oxidation State | | | | | | |
|---|---|---|---|---|---|---|---|
| | +1 | +2 | +3 | +4 | +5 | +6 | +7 |
| Al | $Al_3N$ | $Al_3N_2$ | *AlN | N/A | N/A | N/A | N/A |
| Bi | $Bi_3N$ | $Bi_3N_2$ | *BiN | $Bi_3N_4$ | $Bi_3N_5$ | N/A | N/A |
| Bo | $B_3N$ | $B_3N_2$ | *BN | N/A | N/A | N/A | N/A |
| Ce | $Ce_3N$ | $Ce_3N_2$ | *CeN | $Ce_3N_4$ | N/A | N/A | N/A |
| Co | $Co_3N$ | $Co_3N_2$ | *CoN | N/A | N/A | N/A | N/A |
| Cr | $Cr_3N$ | $Cr_3N_2$ | *CrN | $Cr_3N_4$ | $Cr_3N_5$ | *$CrN_2$ | N/A |
| Cu | *$Cu_3N$ | $Cu_3N_2$ | CuN | N/A | N/A | N/A | N/A |
| Fe | $Fe_3N$ | $Fe_3N_2$ | *FeN | $Fe_3N_4$ | N/A | N/A | N/A |
| Ge | $Ge_3N$ | $Ge_3N_2$ | GeN | *$Ge_3N_4$ | N/A | N/A | N/A |
| Hf | $Hf_3N$ | $Hf_3N_2$ | *HfN | $Hf_3N_4$ | N/A | N/A | N/A |
| In | $In_3N$ | $In_3N_2$ | *InN | N/A | N/A | N/A | N/A |
| La | $La_3N$ | $La_3N_2$ | *LaN | N/A | N/A | N/A | N/A |
| Mn | $Mn_3N$ | *$Mn_3N_2$ | MnN | $Mn_3N_4$ | $Mn_3N_5$ | $MnN_2$ | *$MnN_3^{2-}$ |
| Mo | $Mo_3N$ | $Mo_3N_2$ | *MoN | $Mo_3N_4$ | $Mo_3N_5$ | $MoN_2$ | N/A |
| Nb | $Nb_3N$ | $Nb_3N_2$ | *NbN | $Nb_3N_4$ | $Nb_3N_5$ | N/A | N/A |
| Sb | $Sb_3N$ | $Sb_3N_2$ | *SbN | $Sb_3N_4$ | $Sb_3N_5$ | N/A | N/A |
| Sc | $Sc_3N$ | $Sc_3N_2$ | *ScN | N/A | N/A | N/A | N/A |
| Si | $Si_3N$ | $Si_3N_2$ | SiN | *$Si_3N_4$ | N/A | N/A | N/A |
| Sn | $Sn_3N$ | $Sn_3N_2$ | SnN | *$Sn_3N_4$ | N/A | N/A | N/A |
| Ta | $Ta_3N$ | $Ta_3N_2$ | *TaN | $Ta_3N_4$ | $Ta_3N_5$ | N/A | N/A |
| Ti | $Ti_3N$ | $Ti_3N_2$ | *TiN | $Ti_3N_4$ | N/A | N/A | N/A |
| V | $V_3N$ | $V_3N_2$ | *VN | $V_3N_4$ | $V_3N_5$ | N/A | N/A |
| Y | $Y_3N$ | $Y_3N_2$ | *YN | N/A | N/A | N/A | N/A |
| Zr | $Zr_3N$ | $Zr_3N_2$ | *ZrN | $Zr_3N_4$ | N/A | N/A | N/A |

Non-stoichiometric oxides may also exist as charge species, such as $NbO_3^-$, $TiO_3^{2-}$, and $SbO_2^-$. Likewise, non-stoichiometric sulfides and nitrides may exist as charge species, such as $VS_3^{2-}$, $Si_2N_6^{10-}$. In some embodiments, non-stoichiometric oxides, sulfides and nitrides may also include mixed valence species such as $Fe_3O_4$, $Mn_3O_4$, mixed metal species, such as $CuFeO_2$, $Co_2S_3$, $Fe_2S_3$, FeN and combinations thereof. Additionally, some non-stoichiometric oxides can exist as hydrated forms that may contain hydroxide species such as $Sn(OH)_2$. In some embodiments, non-stoichiometric compound layer 7107 may have a thickness between zero and ten microns. In other embodiments, non-stoichiometric compound layer 7107 may have a thickness between 1 and 50 nanometers. In some embodiments, non-stoichiometric compound layer 7107 may have a thickness between 1 and 10 nanometers.

Non-stoichiometric compound layer 7107 may be able to absorb or entrap gases such as oxygen, water vapor, carbon dioxide, ammonia, and halogens through physisoprtion, adsorption, or a chemical reaction. For example, a non-stoichiometric compound layer 7107 composed of SiO may react with oxygen that is able to diffuse through sealing layer 7108 to form $SiO_2$, effectively preventing oxygen from reaching layer 7102 through 7106 and preventing oxidation damage to the electrode layers, interfacial layers, and active layer of photovoltaic device 7100. By absorbing, reacting with, or otherwise entrapping any substances that are able to move through sealing layer 7108, non-stoichiometric compound layer 7107 prevents those substances from damaging the photovoltaic device. In some embodiments, a reaction between the non-stoichiometric compound layer 7107 may passivate a portion of the non-stoichiometric compound layer 7107. For example, as an SiO non-stoichiometric oxide layer 7107 reacts with oxygen to form $SiO_2$, the rate of oxygen diffusing into the non-stoichiometric oxide layer 7107 may be slowed down by the portion of non-stoichiometric oxide layer Z107 that has reacted with the oxygen to form $SiO_2$. Examples of reactions between non-stoichiometric oxide layer 7107 and oxygen are shown below.

$$2SiO + O_2 \longrightarrow 2SiO_2 \qquad 1)$$

$$4CoO + O_2 \longrightarrow 2Co_2O_3 \qquad 2)$$

$$Sb_2O_3 + O_2 \longrightarrow Sb_2O_5 \qquad 3)$$

$$2Ce_2O_3 + O_2 \longrightarrow 4CeO_2 \qquad 4)$$

A non-stoichiometric oxide layer and an sealing layer, such as those described above with respect to FIG. 22 may be placed proximate to any electrode illustrated in FIGS. 1-21. For example, a non-stoichiometric oxide layer and an sealing layer may be deposited between Pt/FTO layer 1502 and Glass layer 1501 and/or between FTO layer 1506 and Glass layer 1507 of FIG. 1. As a further example, a non-stoichiometric oxide layer and an encapsulant layer may be used in a device having multiple interfacial and active layers such as device 3900 illustrated by FIG. 9. In an embodiment of such a device, a non-stoichiometric oxide layer and an encapsulant layer may be deposited between electrode 2 3912 and substrate 2 2913 and/or between electrode 1 3902 and substrate 1 3901. Non-stoichiometric compound layer 7107 may be deposited by a variety of methods, including but not limited to spin coating, slot-die printing, chemical vapor deposition, thermal evaporation, sputtering, atomic layer deposition, extrusion, and gravure printing. Non-stoichiometric oxide deposition may further occur under a controlled atmosphere. For example, non-stoichiometric oxide deposition may occur under dry nitrogen, argon, helium, neon, or carbon oxide atmospheres. In some embodiments, the deposition atmosphere may include a controlled amount of water vapor ranging, a vacuum (e.g., less than 760 Torr), or a high vacuum (e.g., less than $10^{-6}$ Torr).

Figure 23:
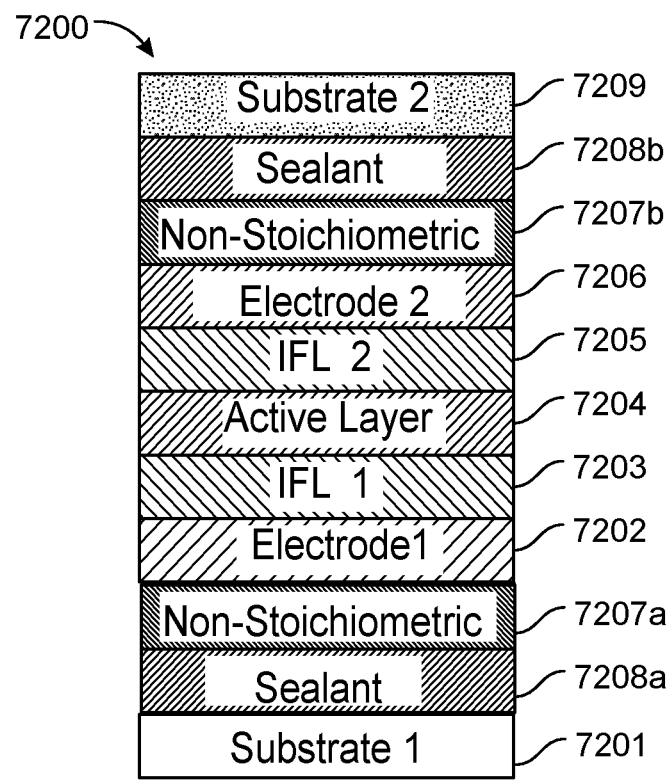

In other embodiments a photovoltaic device may include sealing layers and non-stoichiometric compound layers on both sides of the photovoltaic device. FIG. 23 illustrates an embodiment of a photovoltaic device 7200, similar to photovoltaic device 7100 illustrated by FIG. 22, that includes additional encapsulating layers. Photovoltaic device 7200, includes a sealing layer 7208a and non-stoichiometric compound layer 7207a disposed between substrate 1 7201 and electrode 1 7202, in addition to sealing layer 7208b and non-stoichiometric compound layer 7207b disposed between substrate 2 7209 and electrode 2 7206. Sealing layers 7208a and 7208b may comprise any materials described here in with respect to sealing layer 7108 illustrated by FIG. 22. Likewise, non-stoichiometric compound layers 7207a and 7207b may comprise any materials described here in with respect to non-stoichiometric compound layer 7108 illustrated by FIG. 22.

Figure 24:
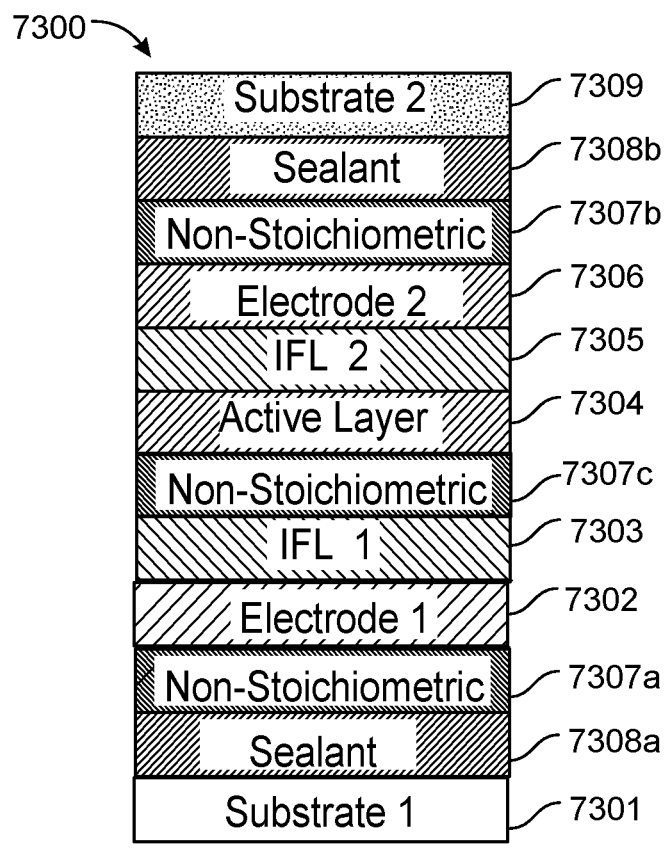
FIG. 24 is a stylized diagram showing components of an exemplar PV device according to some embodiments of the present disclosure.

Further, in some embodiments, a photovoltaic device may include one or more non-stoichiometric compound layers between layers of the device. For example, a photovoltaic device may include a non-stoichiometric compound layer between an interfacial layer and an active layer (e.g. photoactive layer, battery layer, or semi-conductor layer as described herein), between an interfacial layer and an electrode, or between an active layer and an electrode. FIG. 24 illustrates an embodiment of a photovoltaic device 7300, similar to photovoltaic device 7200 illustrated by FIG. 23 and photoactive device 7100 illustrated by FIG. 22. that includes a non-stoichiometric compound layer 7307c disposed between active layer 7304 and interfacial layer 7303. In such an embodiment, non-stoichiometric compound layer 7307c may be sufficiently thin to allow for charge transport between active layer 7304 and interfacial layer 7303. For example, in some embodiments, non-stoichiometric compound layer 7307c may be between 0.5 and 20 nanometers thick. In further embodiments, non-stoichiometric compound layer 7307c may be between 0.5 and 5 nanometers thick. In yet further embodiments, non-stoichiometric compound layer 7307c may be between 0.5 and 1 nanometer thick.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, and set forth every range encompassed within the broader range of values. Also, the terms in the claims have their plain, ordinary meaning unless otherwise explicitly and clearly defined by the patentee.

The invention claimed is:

1. A photovoltaic device comprising:
a first substrate and a second substrate;
a first electrode;
a second electrode;
an active layer disposed at least partially between the first and second electrodes, the active layer comprising a photoactive material;
an interfacial layer disposed at least partially between the first and second electrodes;
an encapsulant layer disposed at least partially between the first substrate and the first electrode or between the second substrate and the second electrode; and
a reactive non-stoichiometric oxide layer disposed at least partially between the first or second electrodes and the encapsulant layer, wherein the reactive non-stoichiometric oxide layer is in direct contact with both the first or second electrodes and the encapsulant layer, wherein the reactive non-stoichiometric oxide layer comprises $V_2O_3$, the first or second electrode is disposed between the reactive non-stoichiometric oxide layer and the interfacial layer, the encapsulant layer has a permeability equal to or less than 200 g/m$^2$ per day when measured at 85 degrees Celsius, and the encapsulant layer comprises one or more compounds each selected from the group consisting of an epoxy, silicone, polypropylene, polybutylene, polyisobutylene, glass, or combinations thereof,
wherein the reactive non-stoichiometric oxide layer further comprises one or more compounds each selected from the group consisting of SiO, CrO$_2$, MnO, FeO, CeO, LaO, HfO, ZrO, TiO, AlO, GeO, or combinations thereof.

2. The photovoltaic device of claim 1, wherein the reactive non-stoichiometric oxide layer further comprises SiO.

3. The photovoltaic device of claim 1, wherein the photoactive material comprises a perovskite material.

4. The photovoltaic device of claim 1, wherein the interfacial layer comprise an oxide, sulfide, or nitride of one or more metals selected from the group consisting of Al, Bi, In, Mo, Ni, Si, Ti, V, Nb, Sn Zn and combinations thereof.

5. The photovoltaic device of claim 1, wherein the reactive non-stoichiometric oxide layer has a thickness equal to or greater than one nanometer and less than or equal to fifty nanometers.

6. The photovoltaic device of claim 1, wherein the encapsulant layer has a thickness equal to or greater than ten microns and less than or equal to ten millimeters.

7. The photovoltaic device of claim 1, wherein the reactive non-stoichiometric oxide layer further comprises one or more compounds selected from the group consisting of Fe$_3$O$_4$, CuFeO$_2$, Mn$_3$O$_4$.

8. The photovoltaic device of claim 1, wherein the first and second electrode layers comprise ITO.

9. A device comprising:
a first substrate and a second substrate;
a first electrode;
a second electrode;
an active layer disposed at least partially between the first and second electrodes;
an encapsulant layer disposed at least partially between the first substrate and the first electrode or between the second substrate and the second electrode; and
a reactive non-stoichiometric oxide layer disposed at least between the first or second electrodes and the encapsulant layer, wherein the reactive non-stoichiometric oxide layer is in direct contact with both the first or second electrodes and the encapsulant layer, wherein the reactive non-stoichiometric oxide layer comprises $V_2O_3$, the first or second electrode is disposed between the reactive non-stoichiometric oxide layer and the active layer, the reactive non-stoichiometric oxide layer has a thickness less than or equal to fifty nanometers, the encapsulant layer has a permeability equal to or less than 200 g/m² per day when measured at 85 degrees Celsius, and the encapsulant layer comprises one or more compounds each selected from the group consisting of an epoxy, silicone, polypropylene, polybutylene, polyisobutylene, glass, or combinations thereof, wherein the reactive non-stoichiometric oxide layer further comprises one or more compounds each selected from the group consisting of SiO, $CrO_2$, MnO, FeO, CeO, LaO, HfO, ZrO, TiO, AlO, GeO, or combinations thereof.

10. The device of claim 9, wherein the reactive non-stoichiometric oxide layer further comprises SiO.

11. The device of claim 9, wherein the active layer comprises a one or more transistors.

12. The device of claim 9, wherein the active layer comprises one or more interfacial layers comprising an oxide, sulfide, or nitride of one or more metals selected from the group consisting of Al, Bi, In, Mo, Ni, Si, Ti, V, Nb, Sn, Zn and combinations thereof.

13. The device of claim 9, wherein the reactive non-stoichiometric oxide layer has a thickness equal to or greater than one nanometer.

14. The device of claim 9, wherein the encapsulant layer has a thickness equal to or greater than ten microns and less than or equal to ten millimeters.

15. The device of claim 9, wherein the reactive non-stoichiometric oxide layer further comprises one or more compounds each selected from the group consisting of $Fe_3O_4$, $CuFeO_2$, and $Mn_3O_4$.

16. The device of claim 9, wherein the first and second electrode layers comprise ITO.

17. A photovoltaic device comprising:
a first substrate and a second substrate;
a first electrode;
a second electrode;
an active layer disposed at least partially between the first and second electrodes, the active layer comprising a photoactive material ;
an interfacial layer disposed at least partially between the first and second electrodes;
a first encapsulant layer disposed at least partially between the first substrate and the first electrode;
a second encapsulant layer disposed at least partially between the second substrate and the second electrode;
a first reactive non-stoichiometric oxide layer disposed at least partially between the first electrode and the first encapsulant layer, wherein the first reactive non-stoichiometric oxide layer is in direct contact with both the first electrode and the first encapsulant layer, wherein the first reactive non-stoichiometric oxide layer comprises $V_2O_3$, and the first electrode is disposed between the first reactive non-stoichiometric oxide layer and the interfacial layer; and
a second reactive non-stoichiometric oxide layer disposed at least partially between and in contact with the second electrode and the second encapsulant layer, wherein the second reactive non-stoichiometric oxide layer comprises $V_2O_3$, second electrode is disposed between the second reactive non-stoichiometric oxide layer and the interfacial layer, the first and second encapsulant layers have a permeability equal to or less than 200 g/m² per day when measured at 85 degrees Celsius, and the encapsulant layer comprises one or more compounds each selected from the group consisting of an epoxy, silicone, polypropylene, polybutylene, polyisobutylene, glass, or combinations thereof, wherein the first and second reactive non-stoichiometric oxide layers further comprise one or more compounds each selected from the group consisting of SiO, $CrO_2$, MnO, FeO, CeO, LaO, HfO, ZrO, TiO, AlO, GeO, or combinations thereof.

18. The device of claim 17, wherein the first and second reactive non-stoichiometric oxide layers further comprise SiO.

* * * * *